(12) United States Patent
Park et al.

(10) Patent No.: US 9,406,393 B2
(45) Date of Patent: Aug. 2, 2016

(54) NONVOLATILE MEMORY DEVICES AND PROGRAM VERIFICATION METHODS USING ONE VERIFICATION VOLTAGE TO VERIFY MEMORY CELLS HAVING DIFFERENT TARGET STATES

(71) Applicants: Ilhan Park, Suwon-Si (KR); Ji-Suk Kim, Seoul (KR); Jung-Ho Song, Suwon-Si (KR); Yang-Lo Ahn, Seoul (KR)

(72) Inventors: Ilhan Park, Suwon-Si (KR); Ji-Suk Kim, Seoul (KR); Jung-Ho Song, Suwon-Si (KR); Yang-Lo Ahn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/668,043

(22) Filed: Mar. 25, 2015

(65) Prior Publication Data

US 2016/0055919 A1  Feb. 25, 2016

(30) Foreign Application Priority Data

Aug. 25, 2014  (KR) .......................... 10-2014-0110864

(51) Int. Cl.
*G11C 16/04* (2006.01)
*G11C 16/34* (2006.01)
*G11C 16/10* (2006.01)
*G11C 16/08* (2006.01)

(52) U.S. Cl.
CPC ............ *G11C 16/3459* (2013.01); *G11C 16/08* (2013.01); *G11C 16/10* (2013.01)

(58) Field of Classification Search
CPC ....................................................... G11C 16/04
USPC ....................................................... 365/185.12
See application file for complete search history.

(56) References Cited

U.S. PATENT DOCUMENTS

| | | | |
|---|---|---|---|
| 7,215,575 B2 | 5/2007 | Chen et al. | |
| 7,643,348 B2 | 1/2010 | Cernea | |
| 7,679,133 B2 | 3/2010 | Son et al. | |
| 8,208,310 B2 | 6/2012 | Dong et al. | |
| 8,274,838 B2 | 9/2012 | Dutta et al. | |
| 8,305,807 B2 | 11/2012 | Shah et al. | |
| 8,503,232 B2 | 8/2013 | Yang | |
| 8,553,466 B2 | 10/2013 | Han et al. | |
| 8,559,235 B2 | 10/2013 | Yoon et al. | |
| 8,611,155 B2 | 12/2013 | Kim et al. | |
| 8,654,587 B2 | 2/2014 | Yoon et al. | |
| 2011/0233648 A1 | 9/2011 | Seol et al. | |
| 2013/0322171 A1 | 12/2013 | Lee et al. | |
| 2015/0155046 A1* | 6/2015 | Lee ........................ | G11C 16/10 365/185.12 |

FOREIGN PATENT DOCUMENTS

| | | |
|---|---|---|
| KR | 10-1044540 B1 | 6/2011 |
| KR | 10-1201888 B1 | 11/2012 |
| KR | 1020130091075 A | 8/2013 |
| KR | 1020130133419 A | 12/2013 |

* cited by examiner

*Primary Examiner* — Harry W Byrne
(74) *Attorney, Agent, or Firm* — Volentine & Whitt, PLLC

(57) ABSTRACT

A program verification method is for a nonvolatile memory device which programs a plurality of memory cells. The program verification method includes applying a plurality of verification voltages, and determining whether programming of memory cells, having different target threshold voltage distributions, from among the plurality of memory cells is completed based on one of the plurality of verification voltages.

20 Claims, 23 Drawing Sheets

NONVOLATILE MEMORY DEVICES AND PROGRAM VERIFICATION METHODS USING ONE VERIFICATION VOLTAGE TO VERIFY MEMORY CELLS HAVING DIFFERENT TARGET STATES

CROSS-REFERENCE TO RELATED APPLICATIONS

A claim of priority under 35 U.S.C. §119 is made to Korean Patent Application No. 10-2014-0110864 filed Aug. 25, 2014, in the Korean Intellectual Property Office, the entire contents of which are hereby incorporated by reference.

BACKGROUND

The inventive concepts described herein relate to semiconductor memories, and more particularly, to nonvolatile memory devices and program verification methods applied to nonvolatile memory devices.

Semiconductor memory devices are fabricated from semiconductors such as silicon (Si), germanium (Ge), gallium arsenide (GaAs), indium phosphide (InP), and the like, and are generally categorized as either volatile or nonvolatile.

Volatile memory devices are characterized by the loss of stored data in a power-off state, and examples thereof include Static RAM (Static Random Access Memory), Dynamic RAM (DRAM), Synchronous DRAM (SDRAM), and so on. In contrast, nonvolatile memory devices are characterized by the retention of stored data in a power-off state, and examples thereof include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RERAM), Ferroelectric RAM (FRAM), and so on.

Among nonvolatile memories, flash memory in particular has been adopted in a wide variety of applications due to its inherent operational advantages such as high memory capacity, low noise characteristics, low power consumption and fast operating speeds.

Flash memory data stores data my controlling the threshold voltage of memory cells, such as floating gate memory cells and charge trap flash (CTF) memory cells. Typically, a flash memory device programs data using an incremental step pulse programming (ISPP) scheme in which data is programmed through execution of a sequence of program loops. Each program loop contains a program step where a program pulse is applied to alter the threshold voltage of a memory cell, followed by a verification step in which a threshold voltage state of the memory cell is read for verification. Generally, the program loops are repeated until a desired threshold voltage state is verified.

SUMMARY

One aspect of embodiments of the inventive concepts is directed to provide a program verification method of a nonvolatile memory device which programs a plurality of memory cells. The program verification method comprises applying a plurality of verification voltages, and determining whether programming of memory cells, having different target threshold voltage distributions, from among the plurality of memory cells is completed based on one verification voltage among the plurality of verification voltages.

In exemplary embodiments, the determining includes determining whether the memory cells having different target threshold voltage distributions are verify-passed, based on the one verification voltage, and determining whether programming of the memory cells having different target threshold voltage distributions is completed, based on a predetermined verification pass count.

In exemplary embodiments, the memory cells having different target threshold voltage distributions are verify-passed when the memory cells having different target threshold voltage distributions are read to be an off cell.

In exemplary embodiments, the determining whether the memory cells having different target threshold voltage distributions are verify-passed, based on the one verification voltage includes changing, when one of the memory cells having different target threshold voltage distributions is verify-passed, a bit value of a data latch corresponding to the verify-passed memory cell. The bit value of the data latch is changed into one of a bit value corresponding to an erase state and bit values corresponding to the plurality of threshold voltage distributions.

In exemplary embodiments, the changing, when one of the memory cells having different target threshold voltage distributions is verify-passed, a bit value of a data latch corresponding to the verify-passed memory cell, includes changing a bit value stored at the data latch based on the bit value stored at the data latch.

In exemplary embodiments, the changing, when one of the memory cells having different target threshold voltage distributions is verify-passed, a bit value of a data latch corresponding to the verify-passed memory cell includes, sequentially changing a bit value stored at the data latch according to a predetermined order.

In exemplary embodiments, the program verification method further comprises program-inhibiting memory cells determined to be program-completed.

Another aspect of embodiments of the inventive concepts is directed to provide a program method of a nonvolatile memory device which includes a plurality of memory cells. The program method comprises sequentially executing a plurality of program loops such that the plurality of memory cells have a plurality of program states. Each of the plurality of program loops includes a program step in which a program pulse is applied to a selected word line, and a verification step in which a plurality of verification voltages are applied to the selected word line to verify whether programming of the plurality of memory cells is completed. The determining whether programming of memory cells, having different target program states, from among the plurality of memory cells is completed is verified by one verification voltage among the plurality of verification voltages.

In exemplary embodiments, the verification step includes determining whether memory cells having different target program states is verify-passed, based on the one verification voltage.

In exemplary embodiments, program completion conditions of the memory cells having different target program states have verification pass counts that are variable according to the different target program states.

In exemplary embodiments, the verification step further includes changing, when the verify-passed memory cell exists at the memory cells having different target program states, a bit value of a data latch corresponding to the verify-passed memory cell.

In exemplary embodiments, when the verify-passed memory cell exists at the memory cells having different target program states, a bit value of a data latch corresponding to the verify-passed memory cell, includes changing the bit value of the data latch into one of a bit value corresponding to an erase state and bit values corresponding to the plurality of program states.

In exemplary embodiments, the changing, when the verify-passed memory cell exists at the memory cells having different target program states, a bit value of a data latch corresponding to the verify-passed memory cell, further includes changing the bit value of the data latch according to a predetermined order.

In exemplary embodiments, the changing, when the verify-passed memory cell exists at the memory cells having different target program states, a bit value of a data latch corresponding to the verify-passed memory cell, further includes changing the bit value of the data latch into a bit value corresponding to a program state having a threshold voltage distribution lower than that of a program state corresponding to the bit value of the data latch.

In exemplary embodiments, the changing the bit value of the data latch into a bit value corresponding to a program state having a threshold voltage distribution lower than that of a program state corresponding to the bit value of the data latch, includes changing, when a threshold voltage distribution lower than that of a program state corresponding to the bit value of the data latch is lower than the one verification voltage, the bit value of the data latch into a bit value corresponding to the erase state.

In exemplary embodiments, the program method further comprises program-inhibiting a memory cell, corresponding to a data latch of which the bit value is changed, when the changed bit value of the data latch is a bit value corresponding to an erase state.

Still another aspect of embodiments of the inventive concepts is directed to provide a nonvolatile memory device comprising a memory cell array including a plurality of memory cells, a page buffer connected to the memory cell array through a plurality of bit lines and adapted to temporarily store a plurality of data bits to be stored at the plurality of memory cells, an address decoder connected to the memory cell array through a plurality of word lines and adapted to select at least one of the plurality of word lines, and a control logic and voltage generator block adapted to control programming such that memory cells connected to the selected word line have target program states corresponding to the plurality of data bits temporarily stored at the page buffer. The control logic and voltage generator block applies a plurality of verification voltages to the selected word line to determine whether programming of the memory cells connected to the selected word line is completed, and the control logic and voltage generator block determines whether programming of memory cells, having different target program states, from among the memory cells connected to the selected word line is completed, based on one verification voltage among the plurality of verification voltages.

In exemplary embodiments, program completion conditions of the memory cells of the different target program states verify-passed by the one verification voltage are different from each other, and the program completion conditions include verify-passed counts of the memory cells.

In exemplary embodiments, the page buffer includes a plurality of data latches corresponding to memory cells connected to the selected word line, and the data latches store bit values, corresponding to target program states of the corresponding memory cells, from among the plurality of data bits.

In exemplary embodiments, when at least one of the memory cells of the different target program states is verify-passed, a bit value of a data latch corresponding to the verify-passed memory cell is changed.

In exemplary embodiments, a bit value of the data latch corresponding to the verify-passed memory cell is changed into one of bit values corresponding to an erase state and the plurality of program states.

In exemplary embodiments, a bit value of the data latch corresponding to the verify-passed memory cell is sequentially changed according to a predetermined order.

In exemplary embodiments, the verify-passed memory cell is program-inhibited when a bit value of a data latch corresponding to the verify-passed memory cell is a bit value corresponding to an erase state.

Yet another aspect of embodiments of the inventive concepts is directed to provide a program verification method of a nonvolatile memory device which programs a plurality of memory cells such that the plurality of memory cells have a plurality of target threshold voltage distributions. The program verification method includes applying a verification voltage, and determining whether programming of the plurality of memory cells is completed, based on the verification voltage. Program completion conditions of the plurality of memory cells are different from each other according to the plurality of target threshold voltage distributions.

Verification pass counts of the memory cells verify-passed by the verification voltage may be different according to the plurality of target threshold voltage distributions.

BRIEF DESCRIPTION OF THE FIGURES

Preferred embodiments of the inventive concepts will be described below in detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art. Like numbers refer to like elements throughout.

DETAILED DESCRIPTION

Figure 1:
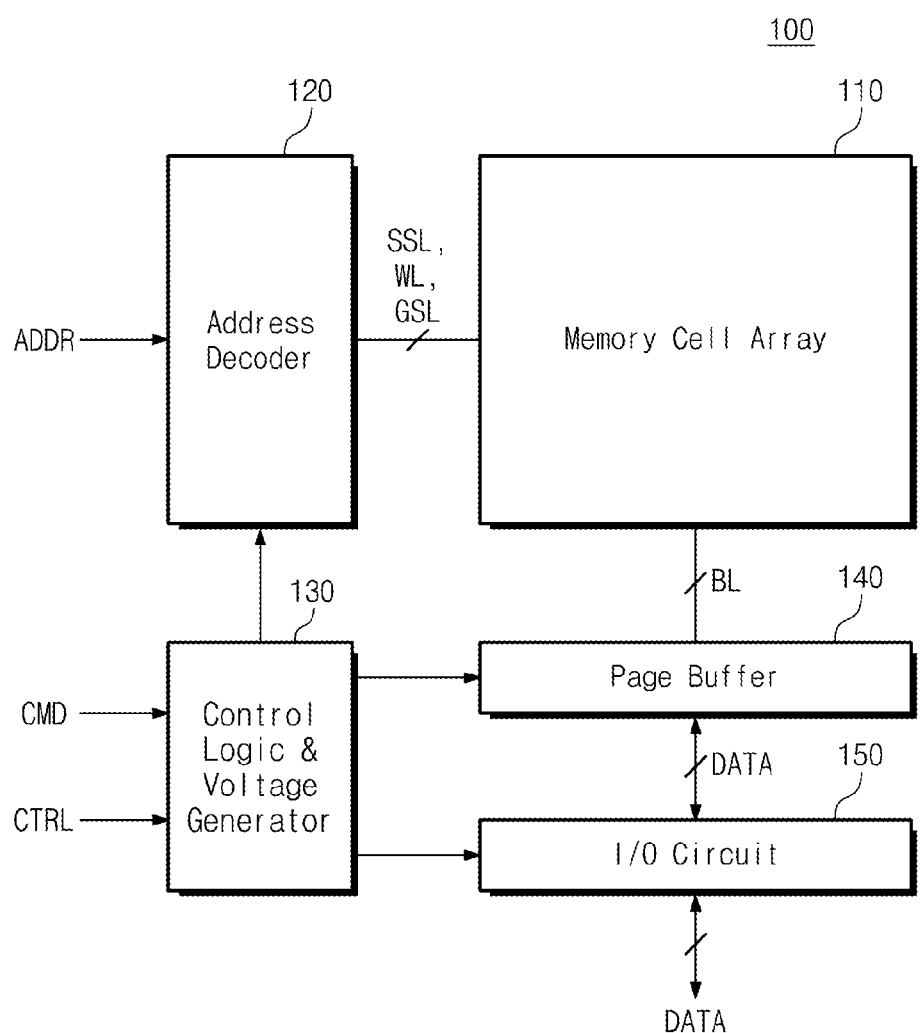
FIG. 1 is a block diagram schematically illustrating a nonvolatile memory device according to an embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A nonvolatile memory device according to embodiments of the inventive concepts programs memory cells such that the memory cells have a plurality of program states (or, a plurality of threshold voltage distributions), respectively. The nonvolatile memory device verifies program states of the memory cells using a plurality of verification voltages. At this time, at least two of the plurality of program states are verified by one verification voltage, but program completion conditions (i.e., program-inhibit conditions) of the at least two program states are different. For example, counts (i.e., verification pass counts) of the at least two program states that memory cells corresponding to the at least two program states are determined as an off cell by one verification voltage are different from each other. Thus, a verification time is shortened because the number of verification voltages applied during verification for the plurality of memory cells. This means that it is possible to provide a nonvolatile memory device with improved performance and an operating method thereof.

FIG. 1 is a block diagram schematically illustrating a nonvolatile memory device according to an embodiment of the inventive concepts. Referring to FIG. 1, a nonvolatile memory device 100 includes a memory cell array 110, an address decoder 120, a control logic and voltage generator block 130, a page buffer 140, and an input/output circuit 150.

The memory cell array 110 includes a plurality of memory blocks, each of which has a plurality of cell strings. As will be described later in connection with FIG. 2, the cell strings may contain a plurality of memory cells and be connected to a plurality of bit lines BL, respectively. The memory cells may also be connected to a plurality of word lines WL, respectively. In exemplary embodiments, memory cells in the memory cell array 110 may be configured to be implemented as a single-level cell that stores one bit of data, and a multi-level cell that stores at least two bits of data.

Still referring to FIG. 1, the address decoder 120 is connected to the memory cell array 110 through a string selection line SSL, the plurality of word lines WL, and a ground selection line GSL. The address decoder 120 decodes a column address of an address ADDR received from an external device (e.g., a memory controller, a host, or an application processor) to select at least one word line of the plurality of word lines WL. The address decoder 120 controls voltages of the word lines WL such that reading or writing of a selected word line is performed. The address decoder 120 may decode a column address of the received address and output the decoded column address to the page buffer 140. The page buffer 140 may control bit lines BL in response to the decoded column address.

The control logic and voltage generator block 130 controls the address decoder 120, the page buffer 140, and the input/output circuit 150 in response to a command CMD and a control signal CTRL from the external device. For example, the control logic and voltage generator block 130 controls the address decoder 120, the page buffer 140, and the input/output circuit 150 in response to the command CMD and the control signal CTRL such that data is written at the memory cell array 110. The control logic and voltage generator block 130 controls the address decoder 120, the page buffer 140, and the input/output circuit 150 in response to the command CMD and the control signal CTRL such that data stored at the memory cell array 110 is output. Alternatively, the control logic and voltage generator block 130 controls the address decoder 120, the page buffer 140, and the input/output circuit 150 in response to the command CMD and the control signal CTRL such that the memory cell array 110 is partially erased.

The control logic and voltage generator block 130 also generates a variety of voltages that are needed for an operation of the nonvolatile memory device 100. Examples of such voltages generated by the control logic and voltage generator block 130 include read voltages, verification voltages, program voltages, pass voltages, and erase voltages. Generally, these voltages are provided by control logic and voltage generator block 130 to the address decoder 120.

The page buffer 140 is connected to the memory cell array 110 via the plurality of bit lines BL. The page buffer 140 temporarily stores data to be written in the memory cell array 110 or read from the memory cell array 110. In exemplary embodiments, the page buffer 140 may contain a plurality of latch circuits which temporarily store data. In exemplary embodiments, the plurality of latch circuits may be connected to the plurality of bit lines BL, respectively.

The input/output circuit 150 receives data from the external device and transfers the received data to the page buffer 140 under control of the control logic and voltage generator block 130. Also, the input/output circuit 150 transmits data from the page buffer 140 to the external device under control of the control logic and voltage generator block 130.

In exemplary embodiments, during programming of the nonvolatile memory device 100, data to be programmed at the memory cell array 110 may be temporarily stored at the page buffer 140. The nonvolatile memory device 100 may program the data stored at the page buffer 140 at the memory cell array 110 by performing a plurality of program loops. As will be explained in greater detail later herein, each program loop contains a program step for applying of a program pulse and a verification step for applying of a verification voltage.

In exemplary embodiments, program states (or, threshold voltage distributions) of memory cells may depend on data stored at the page buffer 140. For example, the target program states (or, target threshold voltage distributions) of memory cells may depend on a predetermined bit ordering. The nonvolatile memory device 100 may execute a plurality of program loops such that the memory cells have corresponding target program states. Programming of the nonvolatile memory device 100 according to an embodiment of the inventive concepts will be more fully described with reference to FIGS. 6 through 8.

Figure 2:
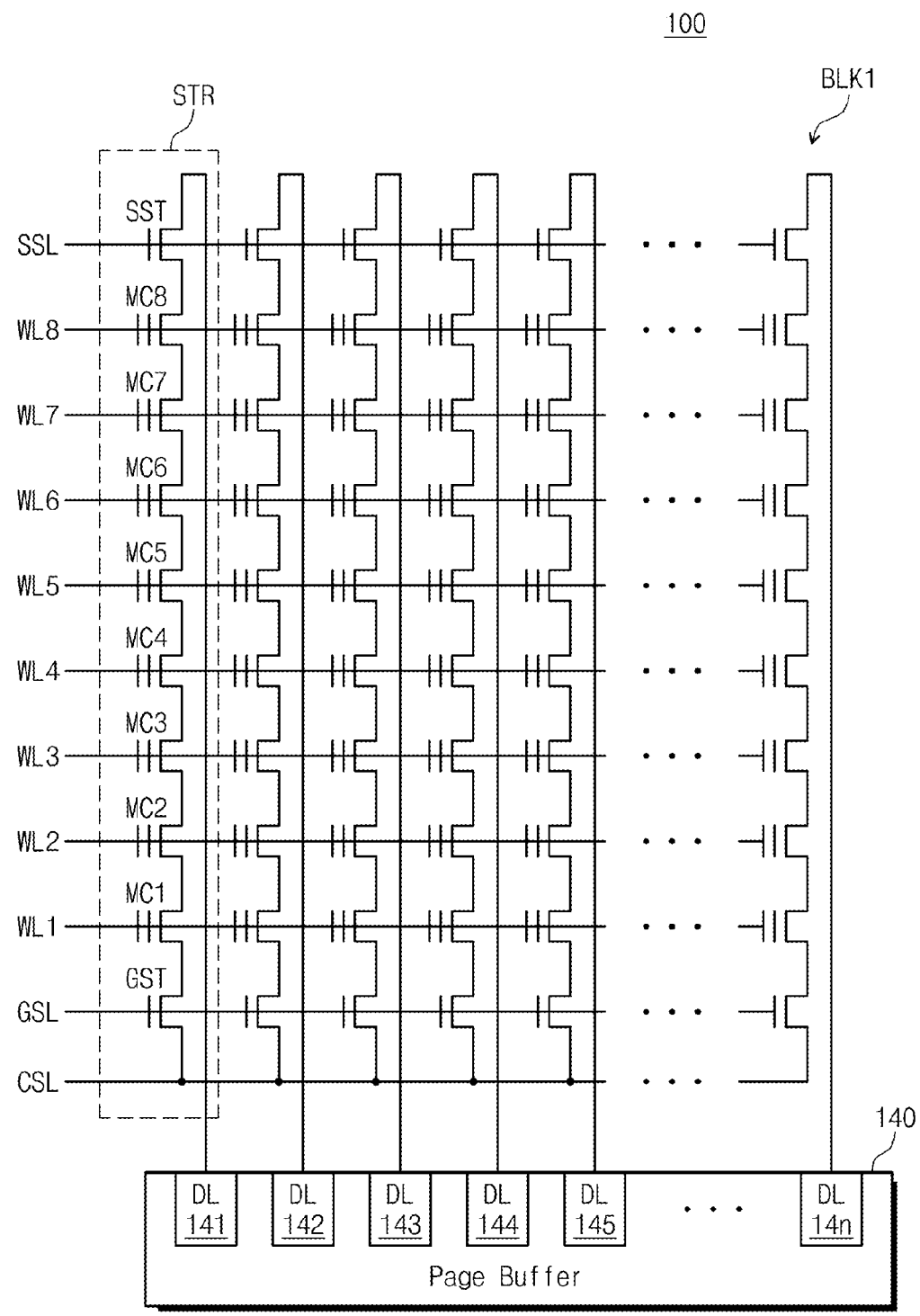
FIG. 2 is a diagram showing an example of a page buffer and a memory block among a plurality of memory blocks included in the nonvolatile memory device shown in FIG. 1.

FIG. 2 is a diagram showing an example of a page buffer and a memory block among a plurality of memory blocks included in the memory cell array 110 shown in FIG. 1. For simplicity of description, only a first memory block BLK1 and a page buffer 140 connected with the first memory block BLK1 are illustrated in FIG. 2. However, the inventive concepts are not limited to the particular configuration shown in FIG. 2. Also, it will be understood that the memory cell array 110 of FIG. 1 may have a plurality of memory blocks.

Referring collectively to FIGS. 1 and 2, the first memory block BLK1 of this example contains a plurality of cell strings STR, each of which has a string selection transistor SST, a plurality of memory cells MC1 through MC8, and a ground selection transistor GST. In each string STR, the string selection transistor SST is connected to a string selection line SSL, the memory cells MC1 through MC8 to word lines WL1 through WL8, and the ground selection transistor GST to a ground selection line GSL.

The cell strings STR are connected to the page buffer 140 through corresponding bit lines BL. In exemplary embodiments, the cell strings STR are respectively connected to data latches 141 through 14n of the page buffer 140 through the bit lines BL.

In exemplary embodiments, the nonvolatile memory device 100 programs or reads data on a page by page basis. One or more pages of data are stored in the memory cells connected with a given word line (e.g., WL3). One word line (e.g., WL3) is selected upon programming of the nonvolatile memory device 100. Data stored at the data latches 141 through 14n are programmed at memory cells connected with a selected word line. For example, when data "00" is stored at the first data latch 141, one, connected with the selected word line, from among memory cells of a string STR connected to the first data latch 141 is programmed to have a threshold voltage corresponding to data "00".

As mentioned above, the inventive concepts are limited to the example of FIG. 2. For example, in exemplary embodiments, the number of columns (strings) of the first memory block BLK1 may increase or decrease relative to that shown in FIG. 2. In this case, the number of data latches DL and the number of bit lines BL may increase or decrease according to the number of strings STR.

Also in exemplary embodiments, the number of rows of the first memory block BLK1 may increase or decrease relative to that shown in FIG. 2. For example, the number of memory cells included in each string of the first memory block BLK1 may increase or decrease. In this case, the number of word lines may increase or decrease according to the number of memory cells included in the string STR.

Also in exemplary embodiments, the number of string selection transistor SST and/or ground selection transistors GST included in each string STR may increase relative to that shown in FIG. 2. In this case, the number of string selection lines SSL or ground selection lines GSL may increase according to the number of string selection transistors SST or ground selection transistors GST of each string STR.

Figure 3:
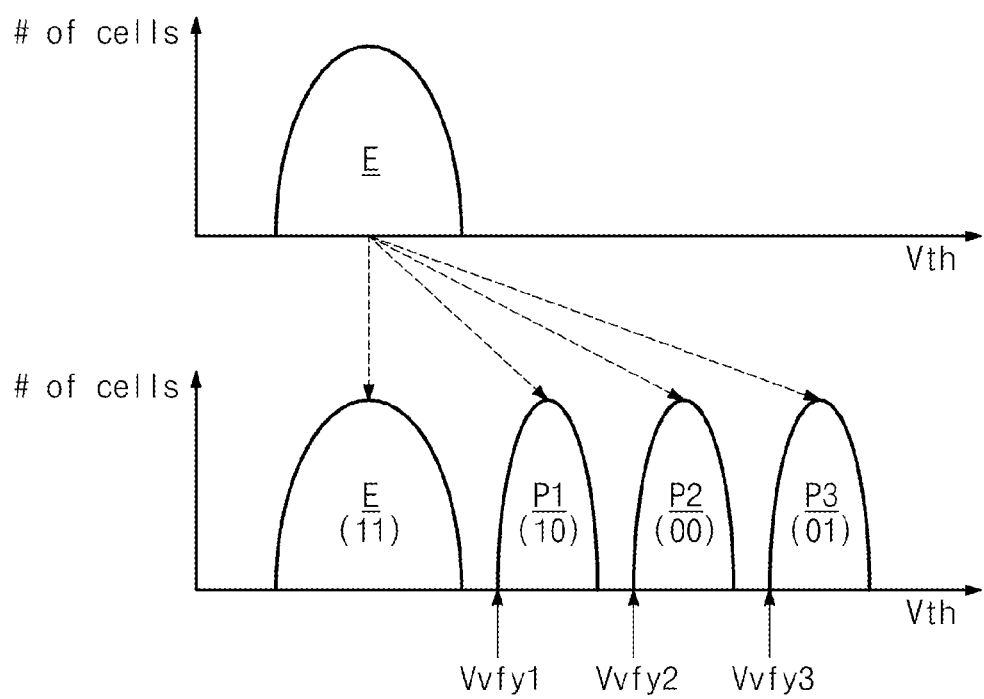
FIG. 3 is a distribution diagram showing an example of threshold voltage distributions of memory cells shown in FIG. 2.
Figure 4:
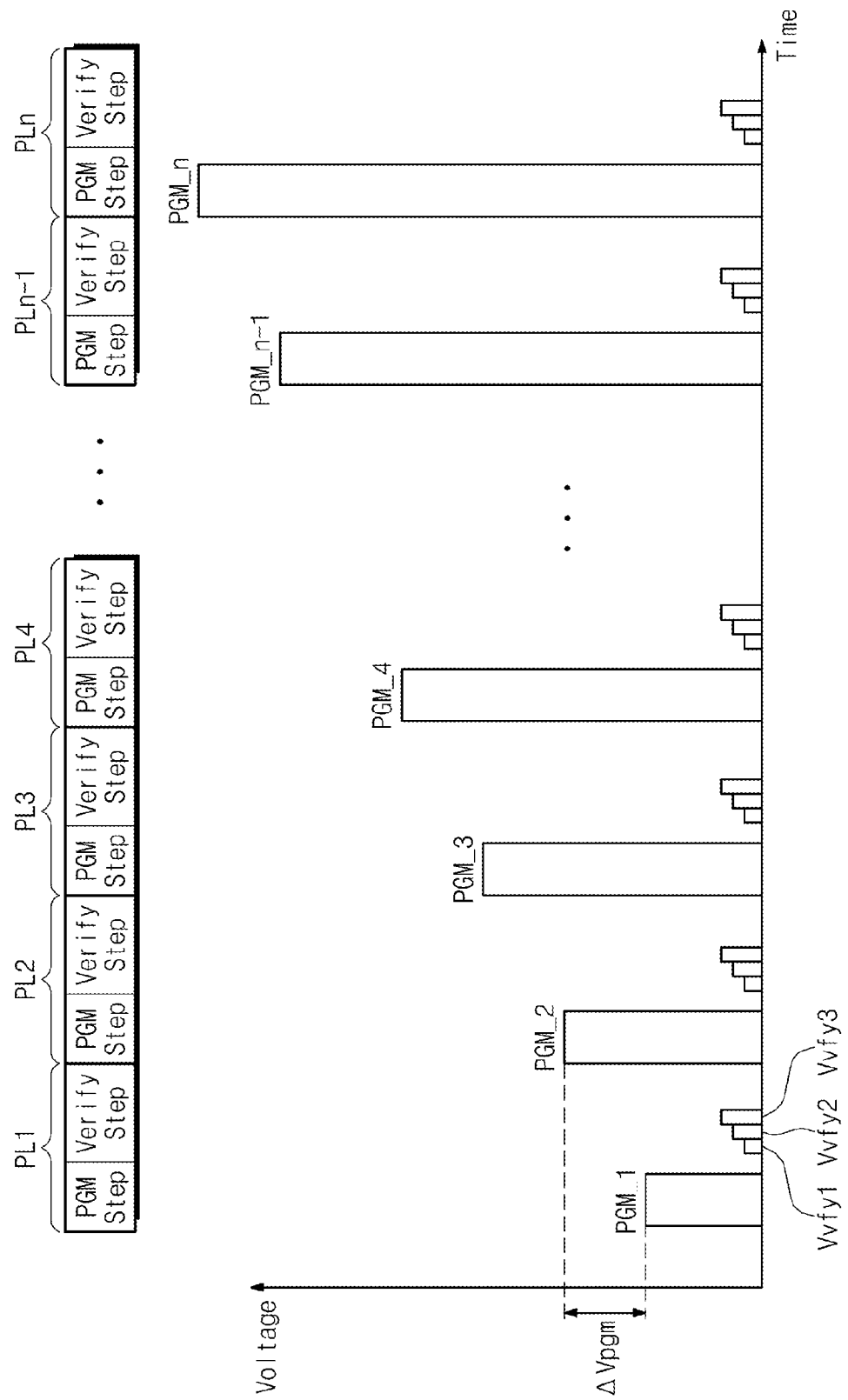
FIG. 4 is a diagram for reference in describing an example of a program method for forming the threshold voltage distributions shown in FIG. 3.

FIG. 3 is a distribution diagram showing an example of threshold voltage distribution of memory cells shown in FIG. 2. FIG. 4 is a diagram for reference in describing an example of a program method for forming threshold voltage distributions shown in FIG. 3. For brevity of description, it is assumed that each of a plurality of memory cells is a multi-level cell storing 2-bit data. However, the scope and spirit of the inventive concepts is not limited thereto. For example, each memory cell may be a triple level cell (TLC) storing 3-bit data or a multi-level cell storing four or more bits.

Also, it is assumed that an erase state E corresponds to data "11", a first program state P1 to data "10", a second program state P2 to data "00", and a third program state P3 to data "01". However, the inventive concepts are not limited to bit ordering of this particular example.

Referring collectively to FIGS. 2 through 4, a plurality of memory cells may have the erase state E. The memory cells having the erase state E may be programmed to have one of the erase state E and the first through third program states P1 through P3.

As illustrated in FIG. 4, the nonvolatile memory device 100 may execute a sequence of program loops PL1 through PLn such that the memory cells are programmed to have one of the erase state E and the first through third program states P1 through P3. Each of the program loops PL1 through PLn contains a program step for applying one of program pulses PGM_1 through PGM_n, and a verification step for application of the verification voltages Vvfy1 through Vvfy3 to each memory cell being programmed.

For example, when the first program loop PL1 is executed, after the first program pulse PGM_1 is applied, the first through third verification voltages Vvfy1 through Vvfy3 for verifying program states of memory cells are sequentially applied. At this time, memory cells of which the target program state is the first program state P1 are verified using the first verification voltage Vvfy1, memory cells of which the target program state is the second program state P2 are verified using the second verification voltage Vvfy2, and memory cells of which the target program state is the third program state P3 are verified using the third verification voltage Vvfy3.

Memory cells that are verify-passed by each of the verification voltages Vvfy1 through Vvfy3 are determined as having the target program state. Afterwards, the verify-passed memory cells are program-inhibited in a second program loop PL2. A second program pulse PGM_2 which is higher by ΔPGM than the first program pulse PGM_1 is applied to program remaining memory cells (or, non-verify-passed memory cells) other than the program-inhibited memory cells in the second program loop PL2.

Afterwards, a verification operation may be executed substantially the same as that of the first program loop PL1. In exemplary embodiments, that memory cells are verify-passed may mean that the memory cells are determined to be off cells when applied with the verification voltages.

As described above, when the nonvolatile memory device 100 programs multi-level cells (MLC) storing two bits, memory cells of which the target program states are program states P1 through P3 are verified using the first through third verification voltages Vvfy1 through Vvfy3.

Figure 5:
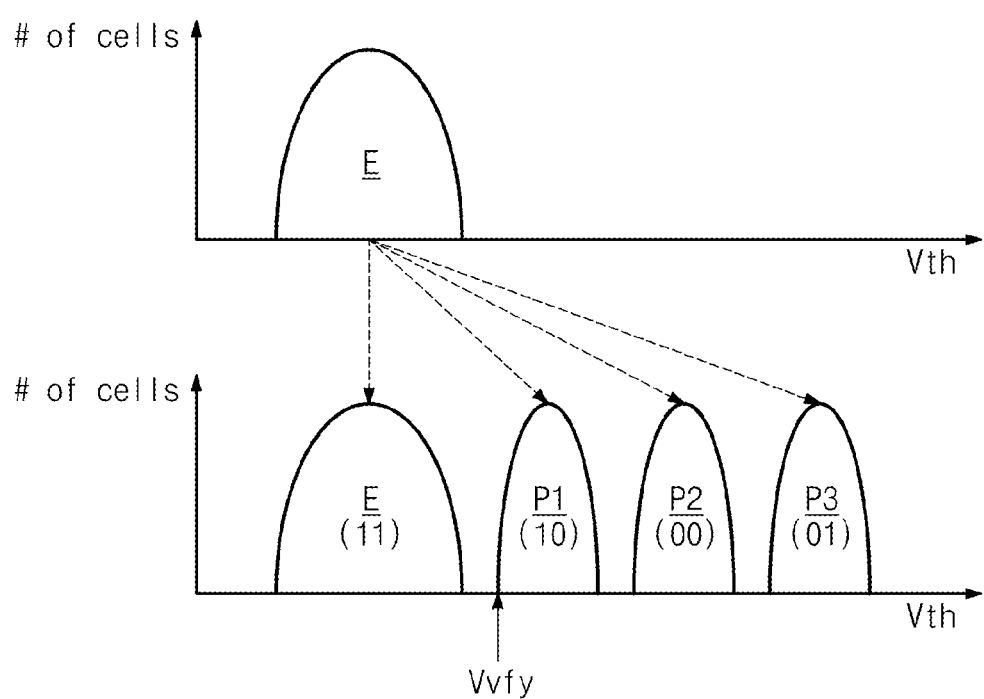
FIGS. 5 and 6 are diagrams for reference in describing a program operation of a nonvolatile memory device according to an embodiment of the inventive concepts.
Figure 6:
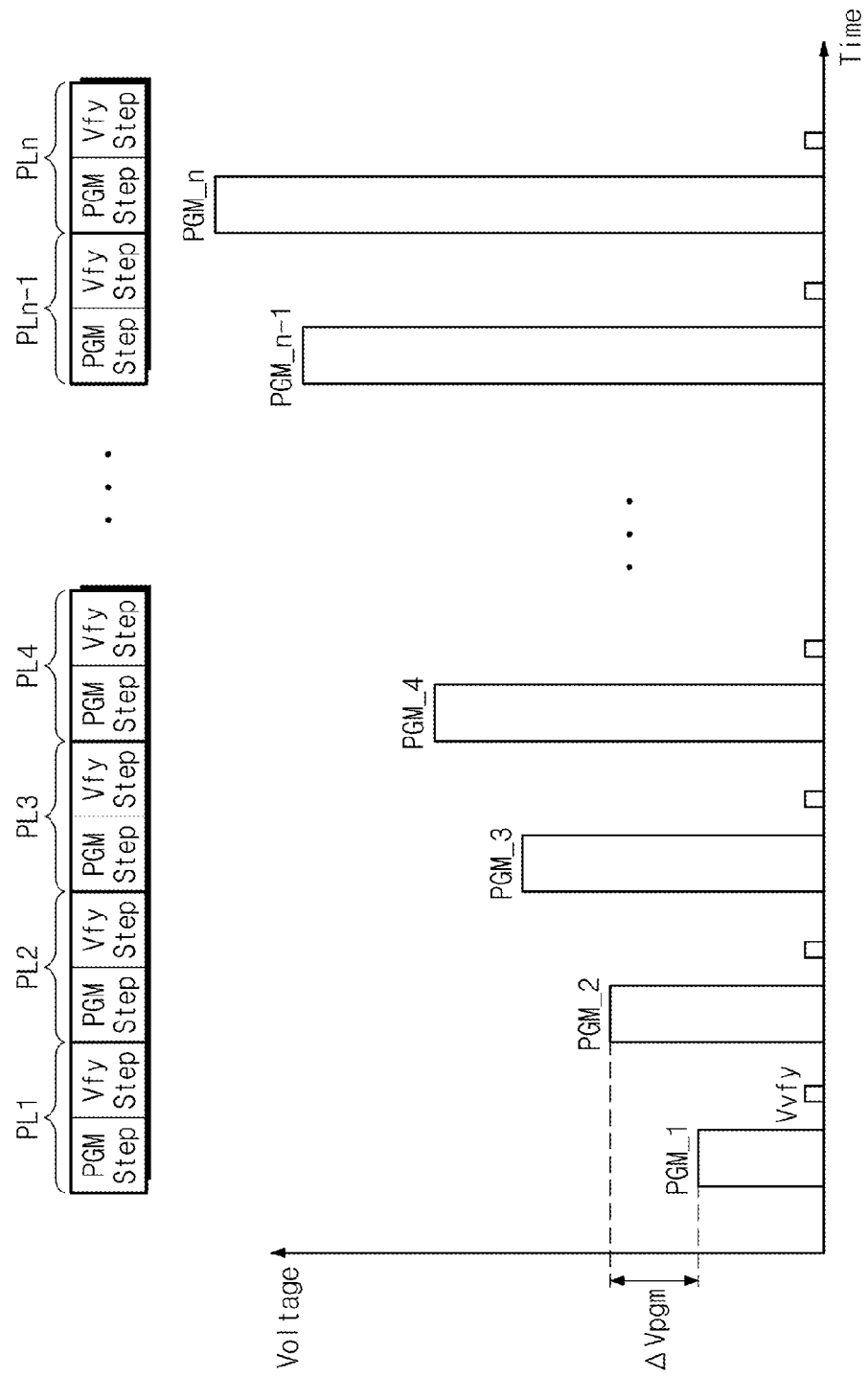

FIGS. 5 and 6 are threshold voltage diagrams for describing a program operation of a nonvolatile memory device according to an embodiment of the inventive concepts. For brevity of description, the case in which a memory cell is determined to be an off cell when applied with a verification voltage Vvfy in a verification step is referred to as "verification pass", and the case in which a memory cell is program-inhibited by satisfying a program completion condition is referred to as "program completion". That is, memory cells of the program completion state are program-inhibited in a next program loop, but memory cells verify-passed may be not program-inhibited in a next program loop.

Referring to FIGS. 2, 5, and 6, each memory cell may be programmed to have one of an erase state E and first through third program states P1 through P3. At this time, unlike FIGS. 3 and 4, a nonvolatile memory device 100 verifies program states of memory cells using one verification voltage Vvfy.

For example, the nonvolatile memory device 100 executes a plurality of program loops PL1 through PLn to program a plurality of memory cells. Each of the program loops PL1 through PLn contains a program step for applying of program pulses PGM_1 through PGM_n and a verification step for applying a verification voltage Vvfy.

In the verification step, a plurality of memory cells (or, a plurality of program state) may be verified using the verification voltage Vvfy. For example, the memory cells may have one of an erase state E and first through third program states P1 through P3, as a target program state. At this time, memory cells that have the first, second, or third program state P1, P2, or P3 as the target program state are verified using the verification voltage Vvfy.

More specifically, when a target program state of a third memory cell MC3 connected with a third word line WL3 of FIG. 2 is the third program state P3, a threshold voltage of the third memory cell MC3 increases as a plurality of program states PL1 through PLn are executed. When a threshold voltage of the third memory cell MC3 becomes higher than the verification voltage Vvfy by a program pulse PGM_i of an i-th program loop PLi (i being a natural number), the third memory cell MC3 is read as an off cell by the verification voltage Vvfy in a verification step of the i-th program loop PLi. That is, the third memory cell MC3 is verify-passed by the verification voltage Vvfy in the i-th program loop PLi.

When the memory cell is verify-passed, the nonvolatile memory device 100 changes a bit value of a data latch 141 corresponding to the third memory cell MC3. For example, the data latch 141 corresponding to the third memory cell MC3 that has the third program state P3 as the target program state may store data "01". When the third memory cell MC3 is verify-passed by the verification voltage Vvfy, data stored in the data latch 141 is changed into data "00" corresponding to the second program state P2.

Afterwards, the third memory cell MC3 may be verify-passed because a threshold voltage of the third memory cell MC3 is higher than the verification voltage Vvfy in a verification step corresponding to an i+1-th program loop PLi+1. When the third memory cell MC3 is verify-passed in the verification step of the i+1-th program loop PLi+1, data stored at the data latch 141 is changed from data "00" corresponding to the second program state P2 into data "10" corresponding to the first program state P1.

As described above, afterwards, in a verification step of an i+2-th program loop PLi+2, the third memory cell MC3 is verify-passed, and data stored at the data latch 141 is changed from data "10" corresponding to the first program state P1 into data "11" corresponding to the erase state E. At this time, the third memory cell MC3 is determined to be "program completion" and is program-inhibited in subsequent program loops. In other words, the third memory cell MC3 is determined to satisfy a program completion condition.

That is, as described above, the nonvolatile memory device according to an embodiment of the inventive concepts changes values of data latches corresponding to memory cells that are verify-passed by the verification voltage Vvfy. At this time, the nonvolatile memory device 100 sequentially changes values of data latches, based on a current bit value stored at a data latch.

In a program method described with reference to FIGS. 3 and 4, verification about memory cells of which the target program states are different from each other is made using different verification voltages. For example, according to a program method described with reference to FIGS. 3 and 4, a memory cell of which the target program state is the third program state P3 is verified using a third verification voltage Vvfy3. In this case, the memory cell of which the target program state is the third program state P3 is verify-passed once and then is program-inhibited.

However, the nonvolatile memory device 100 according to an embodiment of the inventive concepts verifies memory cells of which the target program states are the first through third program states P1 through P3, using a verification voltage Vvfy. At this time, the nonvolatile memory device 100 sequentially changes values of data latches corresponding to verify-passed memory cells.

For example, when a bit value of a data latch corresponding to a memory cell verify-passed by a verification voltage Vvfy is data "01" (i.e., data corresponding to a third program state P3), the nonvolatile memory device 100 changes a bit value of a data latch, corresponding to a memory cell verify-passed by the verification voltage Vvfy, into data "00" (i.e., data corresponding to the second program state P2). When a bit value of a data latch corresponding to a memory cell verify-passed by the verification voltage Vvfy is data "00" (i.e., data corresponding to the second program state P2), the nonvolatile memory device 100 changes a bit value of a data latch, corresponding to a memory cell verify-passed by the verification voltage Vvfy, into data "10" (i.e., data corresponding to the first program state P1). When a bit value of a data latch corresponding to a memory cell verify-passed by the verification voltage Vvfy is data "10" (i.e., data corresponding to the first program state P1), the nonvolatile memory device 100 changes a bit value of a data latch, corresponding to a memory cell verify-passed by the verification voltage Vvfy, into data "11" (i.e., data corresponding to the erase state E). The nonvolatile memory device 100 program-inhibits memory cells corresponding to data latches at which data "11" (i.e., data corresponding to the erase state E) is stored.

As described above, the nonvolatile memory device 100 according to an embodiment of the inventive concepts verifies memory cells of which the target program states are different from each other, using a verification voltage Vvfy. At this time, program completion conditions of the memory cells of which the target program states are different from each other may be different from each other. The following table 1 shows program completion conditions of memory cells of which the target program states are different from each other.

TABLE 1

| Target program state | Reference verification voltage | Verification pass count by reference verification voltage |
|---|---|---|
| E | — | — |
| P1 | Vvfy | 1 |
| P2 | Vvfy | 2 |
| P3 | Vvfy | 3 |

Referring to the table 1, memory cells of which the target program states are first through third program states P1 through P3 are verified using the verification voltage Vvfy. Only memory cells of which the target program states are the first program state P1 are verify-passed once by the verification voltage Vvfy and then are program-inhibited, memory cells of which the target program states are the second program state P2 are verify-passed two times by the verification voltage Vvfy and then are program-inhibited, and memory cells of which the target program states are the third program state P3 are verify-passed three times by the verification voltage Vvfy and then are program-inhibited.

According to an embodiment of the inventive concepts, memory cells having different target program states are verified using a verification voltage, but program completion conditions of the memory cells having different target program states are different from each other.

Figure 7:
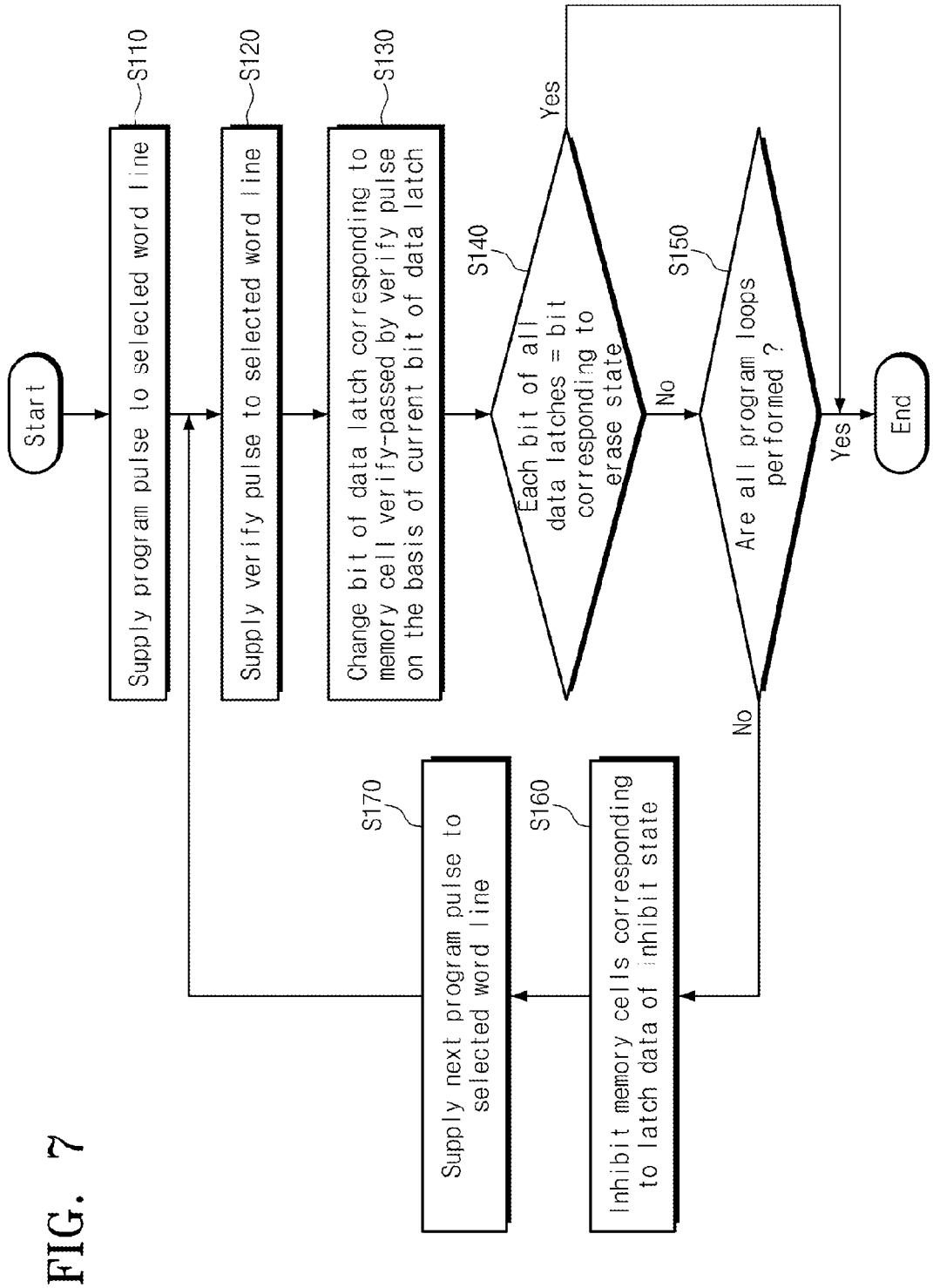
FIG. 7 is a flow chart for reference in describing a program operation of a nonvolatile memory device according to an embodiment of the inventive concepts.

FIG. 7 is a flow chart for reference in describing a program operation of a nonvolatile memory device according to an embodiment of the inventive concepts. Referring to FIGS. 1 and 5 through 7, in step S110, a nonvolatile memory device 100 applies a program pulse to a selected word line. For example, the nonvolatile memory device 100 may receive an address ADDR from an external device (e.g., a memory controller, a host, or an application processor) and select at least one of a plurality of word lines depending on the received address. The nonvolatile memory device 100 applies the program pulse to the selected word line.

In step S120, the nonvolatile memory device 100 applies a verification voltage Vvfy to the selected word line. For example, the nonvolatile memory device 100 applies the verification voltage Vvfy to the selected word line to check whether programming of memory cells connected with the selected word line is completed. The nonvolatile memory device 100 determines whether memory cells connected with the selected word line are on cells or off cells, using the verification voltage Vvfy. In exemplary embodiments, a memory cell determined to be an off cell by the verification voltage Vvfy may be a verify-passed memory cell.

In step S130, the nonvolatile memory device 100 changes a bit value, based on a current bit value of a data latch corresponding to a memory cell verify-passed by the verification voltage Vvfy. For example, when a current bit value of a data latch corresponding to a memory cell verify-passed by the verification voltage Vvfy is data "01" (i.e., data corresponding to a third program state P3), the nonvolatile memory device 100 changes a bit value of the data latch, corresponding to a memory cell verify-passed by the verification voltage Vvfy, into data "00" (i.e., data corresponding to a second program state P2).

That is, when a bit value corresponding to the third program state P3 is stored at a data latch, the nonvolatile memory device 100 changes a bit value of the data latch into a bit value corresponding to the second program state P2. When a bit value corresponding to the second program state P2 is stored at a data latch, the nonvolatile memory device 100 changes a bit value of the data latch into a bit value corresponding to the first program state P1. When a bit value corresponding to the first program state P1 is stored at a data latch, the nonvolatile memory device 100 changes a bit value of the data latch into a bit value corresponding to the erase state E.

In other words, the nonvolatile memory device 100 sequentially changes bit values of data latches corresponding to memory cells verify-passed by the verification voltage Vvfy. Alternatively, the nonvolatile memory device 100 sequentially changes bit values of data latches corresponding to memory cells verify-passed by the verification voltage Vvfy according to a predetermined order.

In step S140, the nonvolatile memory device 100 determines whether each of bit values of data latches corresponding to memory cells connected with the selected word line corresponds to the erase state E. The nonvolatile memory device 100 terminates the program operation when each of bit values of data latches corresponding to memory cells connected with the selected word line corresponds to the erase state E.

As a consequence of determining that each of bit values of data latches corresponding to memory cells connected with the selected word line does not correspond to the erase state E (i.e., memory cells of which the programming is not completed exist), in step S150, the nonvolatile memory device 100 determines whether all program loops are executed.

The nonvolatile memory device 100 terminates the program operation when all program loops are executed.

As a consequence of determining that all program loops are not executed (i.e., when a program loop(s) that has not been executed exists), in step S160, the nonvolatile memory device 100 program-inhibits memory cells corresponding to data latches where a bit value corresponding to the erase state E is stored. For example, the nonvolatile memory device 100 provides a power supply voltage Vcc to a bit line connected with a data latch where a bit value corresponding to the erase state E is stored.

In step S170, the nonvolatile memory device 100 applies a next program pulse to the selected word line. In exemplary embodiments, a level of a program pulse applied in step S170 may be higher than that applied in step S110.

Afterwards, the nonvolatile memory device 100 iterates steps S120 through S170. In exemplary embodiments, a program pulse stepwise increases as steps S120 through S170 are iteratively performed.

According to an embodiment of the inventive concepts, when programming a multi-level cell storing two or more data bits, the nonvolatile memory device 100 verifies a plurality of program states using a verification voltage Vvfy. At this time, program-inhibition conditions (or, program completion condition) of program states are different from each other. Thus, verification speed is improved upon programming of the nonvolatile memory device 100. This means that the performance of the nonvolatile memory device 100 is improved.

Figure 8:
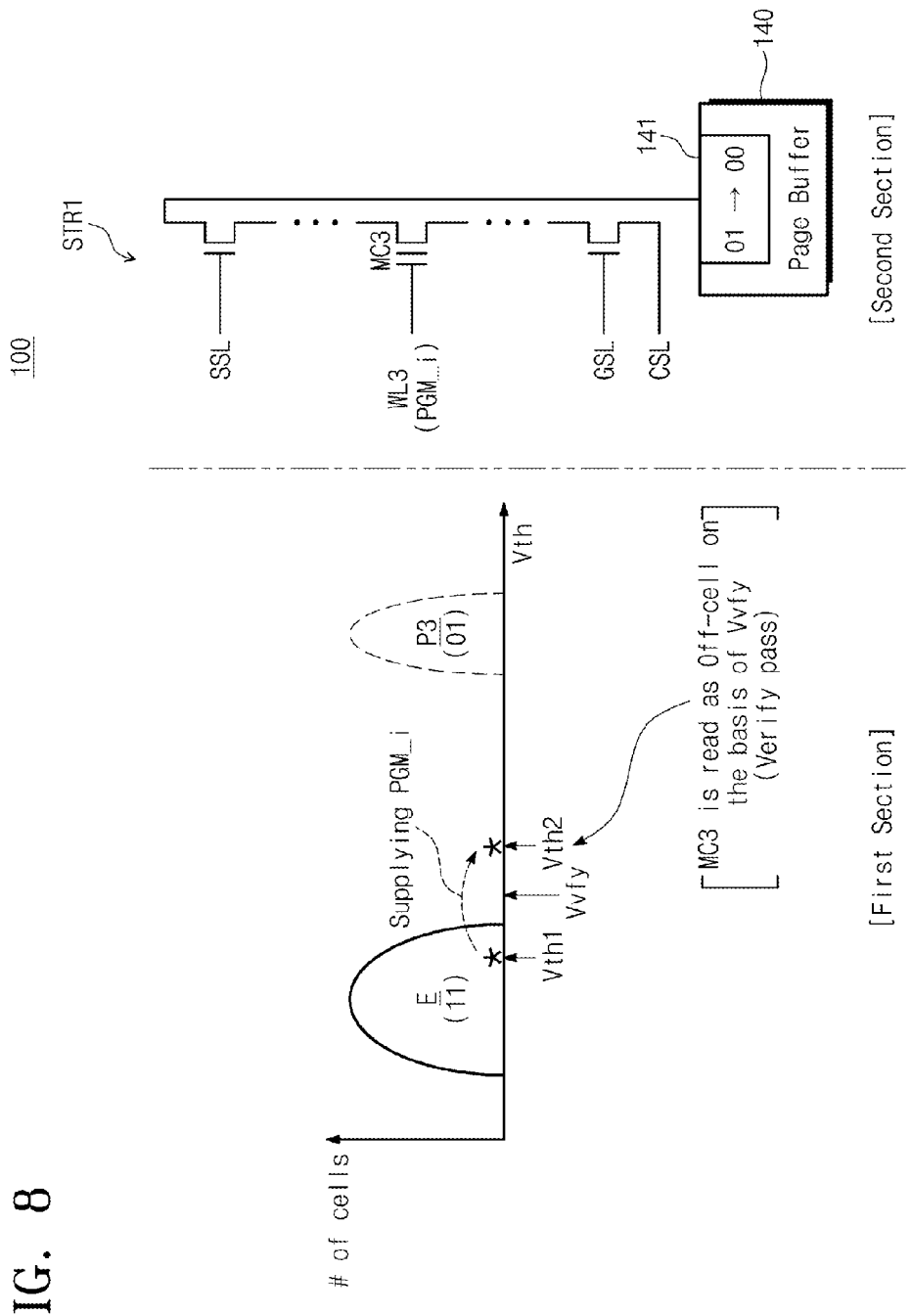
FIGS. 8 through 10 are diagrams for reference in further describing the program operation shown in FIG. 7.
Figure 9:
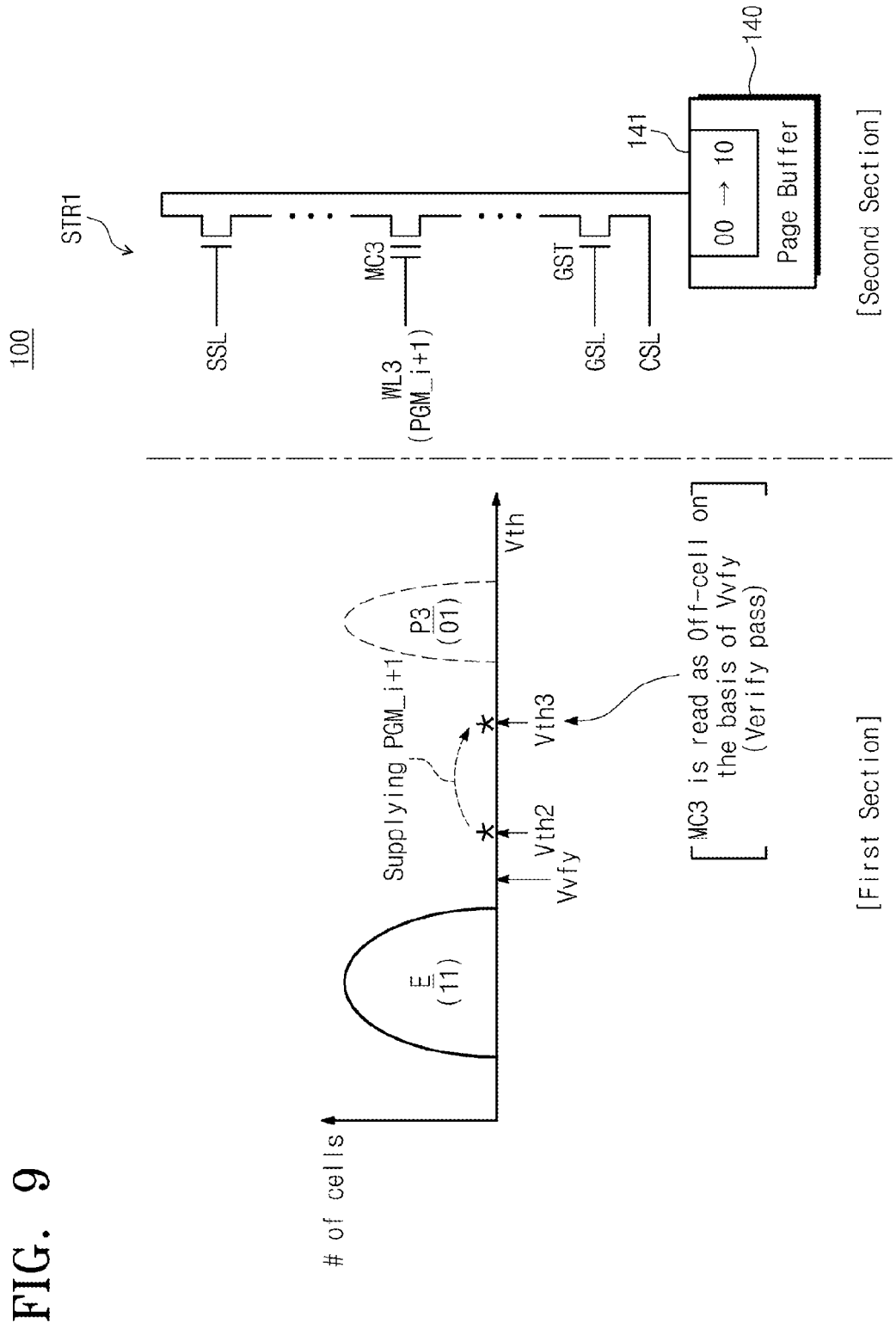
Figure 10:
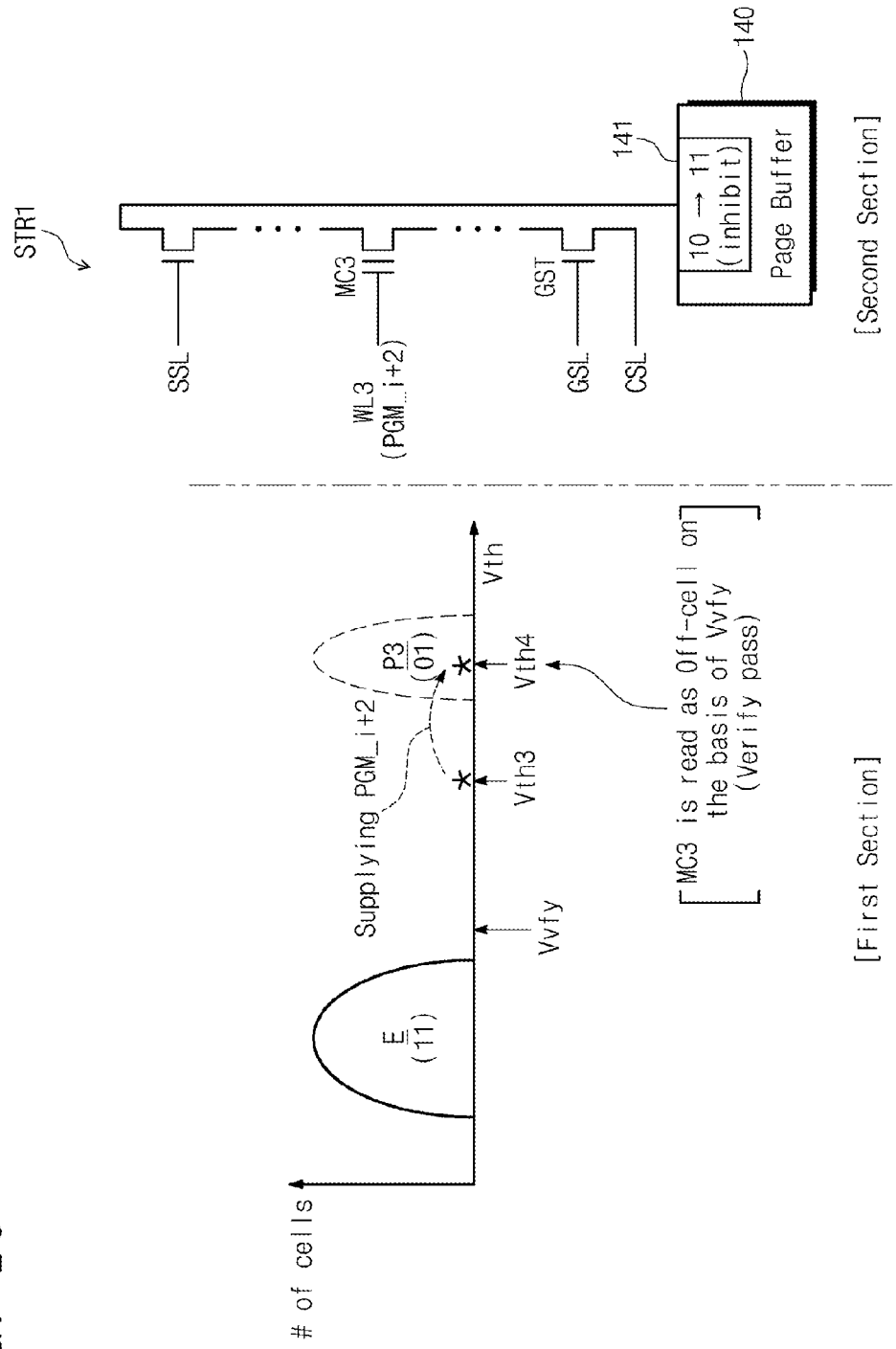

FIGS. 8 through 10 are diagrams for reference in describing a program method shown in FIG. 7. For brevity of description, it is assumed that a selected word line is a third word line, and a target program state of a third memory cell MC3 connected with the third word line WL3 is a third program state P3. Also, a program method of a nonvolatile memory device 100 will be described with respect to a memory cell (i.e., third memory cell MC3). However, the scope and spirit of the inventive concepts may not be limited thereto. Programming of the nonvolatile memory device 100 may be performed in units of a page.

In FIGS. 8 through 10, first sections show a threshold voltage distribution of a plurality of memory cells, and second sections show a first string STR1 and a page buffer 140. Omitted are constituent elements that are unnecessary to describe programming of the third memory cell MC3.

Referring to FIGS. 1 and 5 through 8, the nonvolatile memory device 100 performs a plurality of program loops PL1 through PLn to program the third memory cell MC3, as illustrated in FIG. 6. For example, a threshold voltage of the third memory cell MC3 increases from a first threshold voltage Vth1 to a second threshold voltage Vth2 by a program pulse PGM_i of an i-th program loop PLi.

After applying the i-th program pulse PGM_i, the nonvolatile memory device 100 applies a verification voltage Vvfy to determine a state of the third memory cell MC3. In this case, the third memory cell MC3 is determined to be an off cell by the verification voltage Vvfy because a threshold voltage of the third memory cell MC3 has increased up to the second threshold voltage Vth2 by the i-th program pulse PGM_i, and the second threshold voltage Vth2 is greater than the verification voltage Vvfy.

At this time, the nonvolatile memory device 100, as illustrated in the second section of FIG. 8, changes bit value "01", corresponding to a third program state P3 and stored at a data latch 141, into bit value "00" corresponding to a second program state P2.

That is, after the i-th program loop PLi is completed, the third memory cell MC3 has the second threshold voltage Vth2, and the data latch 141 corresponding to the third memory cell MC3 stores bit value "00" corresponding to the second program state P2.

Next, referring to FIGS. 1, 5, 6, and 9, after performing the i-th program loop PLi, the nonvolatile memory device 100 performs an i+1-th program loop PLi+1. For example, the nonvolatile memory device 100 applies an i+1-th program pulse PGM_i+1 to the third word line WL3. A threshold voltage of the third memory cell MC3 increases up to a third threshold voltage Vth3 from the second threshold voltage Vth2 by the i+1-th program pulse PGM_i+1.

After the i+1-th program pulse PGM_i+1 is applied to the third word line WL3, the nonvolatile memory device 100 applies a verification voltage Vvfy to the third word line WL3 to determine a state of the third memory cell MC3. The third memory cell MC3 is read to be an off cell by the verification voltage Vvfy because a threshold voltage of the third memory cell MC3 has increased up to the third threshold voltage Vth3 by application of the i+1-th program pulse PGM_i+1, and the third threshold voltage Vth3 is greater than the verification voltage Vvfy.

At this time, as illustrated in the second section of FIG. 9, the nonvolatile memory device 100 changes bit value "00", corresponding to the second program state P2 stored at the data latch 141, into bit value "10" corresponding to the first program state P1.

Finally, referring to FIGS. 1, 5, 6, and 10, after performing the i+1-th program loop PLi+1, the nonvolatile memory device 100 performs an i+2-th program loop PLi+2. For example, the nonvolatile memory device 100 applies an i+2-th program pulse PGM_i+2 to the third word line WL3. A threshold voltage of the third memory cell MC3 increases from the third threshold voltage Vth3 to a fourth threshold voltage Vth4 by the i+2-th program pulse PGM_i+2.

After the i+2-th program pulse PGM_i+2 is applied to the third word line WL3, the nonvolatile memory device 100 applies the verification voltage Vvfy to the third word line WL3 to determine a state of the third memory cell MC3. The third memory cell MC3 is read to be an off cell by the verification voltage Vvfy because a threshold voltage of the third memory cell MC3 has increased up to a fourth threshold voltage Vth4 by the i+2-th program pulse PGM_i+2, and the fourth threshold voltage Vth4 is greater than the verification voltage Vvfy.

At this time, as shown in the second section of FIG. 10, the nonvolatile memory device 100 changes bit value "10", corresponding to the first program state P1 stored at the data latch 141, into bit value "11" corresponding to an erase state E.

In subsequent program loops, the nonvolatile memory device 100 program-inhibits the third memory cell MC3 such that the third memory cell MC3 is not programmed.

As described with reference to FIGS. 8 through 10, when a memory cell is read to be an off cell by a verification voltage Vvfy in a verification step of each of a plurality of program loops PL1 through PLn (i.e., when the memory cell is verify-passed), the nonvolatile memory device 100 according to an embodiment of the inventive concepts sequentially changes a bit value of a data latch corresponding to the memory cell determined to be an off cell. In other words, the nonvolatile memory device 100 may sequentially change a bit value of a data latch, corresponding to a memory cell determined to be an off cell, according to a predetermined order. Accordingly, a time taken to verify program states of memory cells is shortened by reducing the number of events where a verification voltage is applied. Thus, a nonvolatile memory device with improved performance is provided.

FIGS. 11 through 14 are diagrams for describing programming of a nonvolatile memory device according to an embodiment of the inventive concepts. In FIGS. 8 through 10, an embodiment of the inventive concepts is exemplified as a third memory cell MC3 is programmed. In contrast, programming about memory cells (i.e., page unit) connected with a third word line (i.e., a selected word line) will be described with reference to FIGS. 11 through 14. Programming of the nonvolatile memory device 100 is performed in units of a page.

Figure 11:
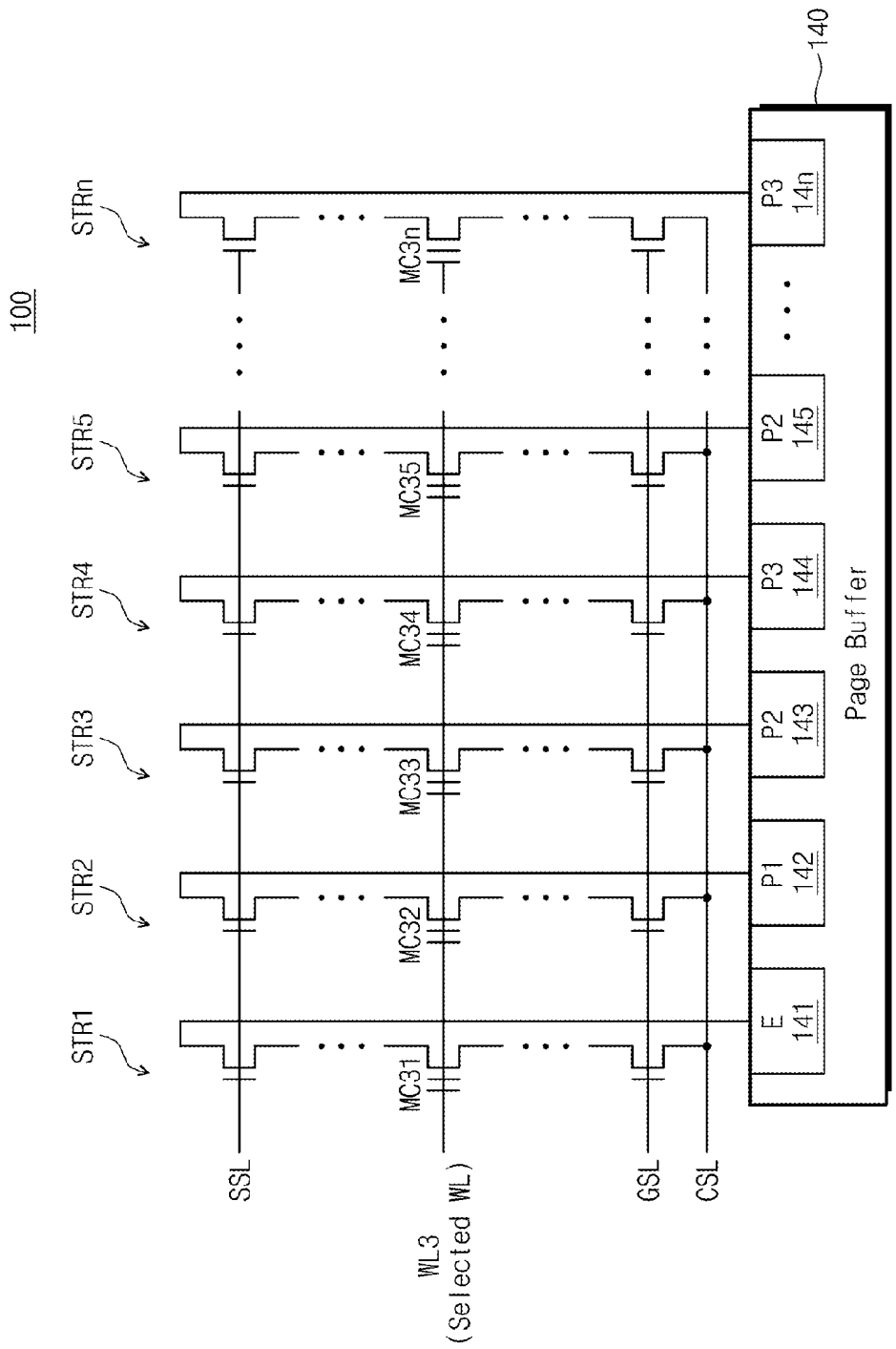
FIGS. 11 through 14 are diagrams for reference in describing programming of a nonvolatile memory device according to an embodiment of the inventive concepts.

Referring to FIGS. 1, 6, and 11, the nonvolatile memory device 100 contains a memory cell array 110 and a page buffer 140. The memory cell array 110 contains first through n-th strings STR1 through STRn, which are connected to the page buffer 140 through bit lines BL. The page buffer 140 includes first through n-th data latches 141 through 14n that are connected to the first through n-th strings STR1 through STRn through the bit lines BL and correspond to the first through n-th strings STR1 through STRn.

For example, a selected word line may be a third word line WL3. The first through n-th strings STR1 through STRn includes memory cells MC31 through MC3n connected with the third word line WL3, respectively.

The nonvolatile memory device 100 receives data from an external device (e.g., a memory controller, a host, or an application processor). The nonvolatile memory device 100 stores the received data at memory cells MC31 through MC3n connected with the third word line WL3 (i.e., the selected word line). For example, the nonvolatile memory device 100 programs the memory cell M31 to an erase state E, the memory cell M32 to a first program state P1, the memory cell M33 to a second program state P2, the memory cell M34 to a third program state P3, the memory cell M35 to the second program state P2, and the memory cell M3n to a third program state P3. Above described program states may be target program states for each of the memory cells MC31 through MC3n.

The nonvolatile memory device 100 stores target program states of the memory cells MC31 through MC3n at the first through n-th data latches 141 through 14n. For example, the nonvolatile memory device 100 stores a bit value corresponding to a target program state of the memory cell MC31 at the first data latch 141 connected with a first string STR1 that includes the memory cell MC31. That is, the bit value stored at the first data latch 141 may be data "11". Likewise, the nonvolatile memory device 100 stores bit values corresponding to target program states of the memory cells MC32 through MC3n at the second through n-th data latches 142 through 14n.

Afterwards, the nonvolatile memory device 100 may perform a plurality of program loops shown in FIG. 6.

Figure 12:
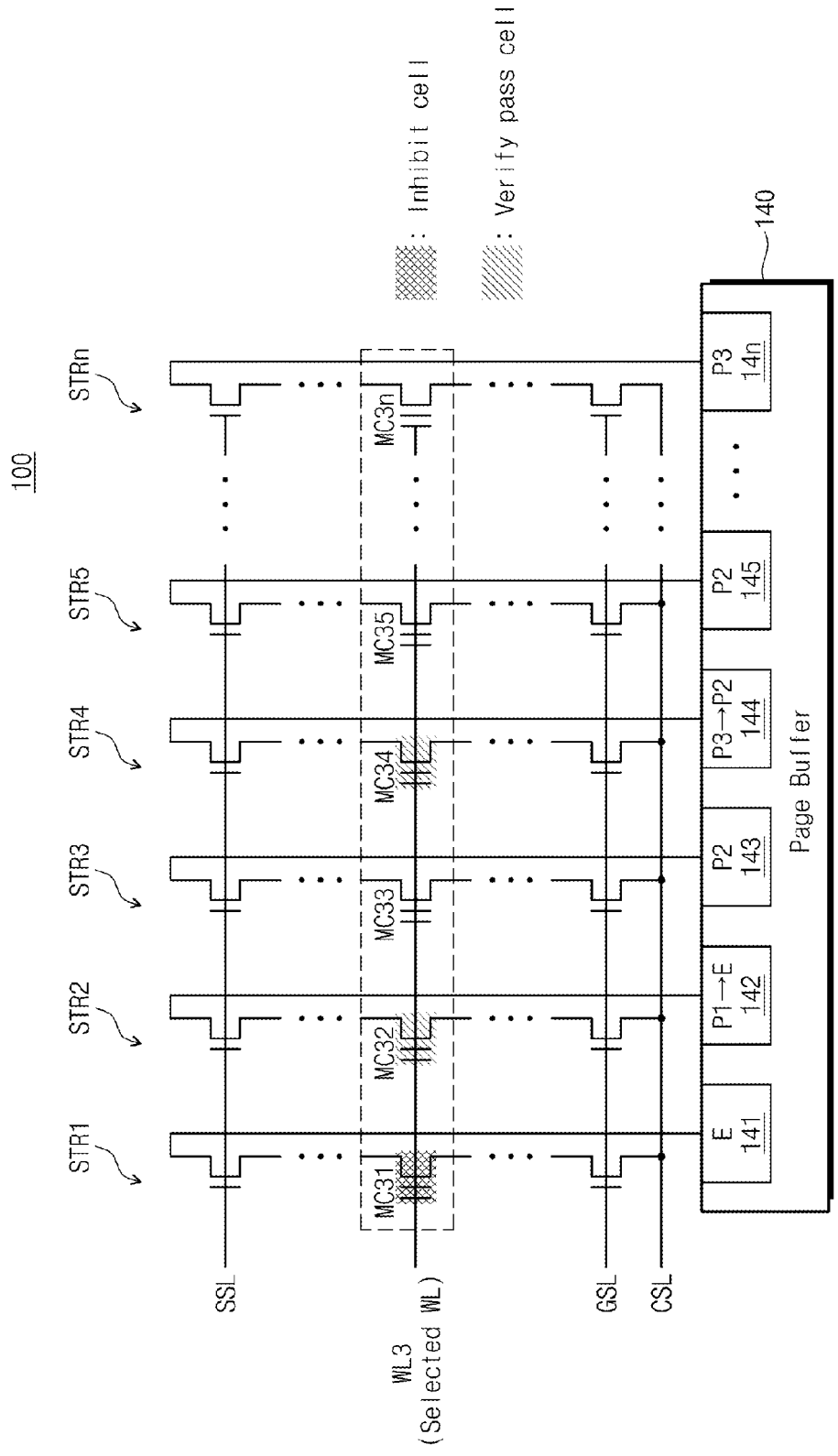

Referring to FIGS. 1, 6, and 12, after predetermined program loops are executed, the memory cells MC32 and MC34 are verify-passed by a verification voltage Vvfy. Threshold voltages of the memory cells MC32 and MC34 become higher than the verification voltage Vvfy as predetermined program loops are executed. In this case, the memory cells MC32 and MC34 are read to be an off cell by the verification voltage Vvfy.

The nonvolatile memory device 100 changes bit values of the data latches 142 and 144 corresponding to the verify-passed memory cells MC32 and MC34 (i.e., memory cells determined to be an off cell by the verification voltage Vvfy). For example, before the predetermined program loops are executed, the data latch 142 stores a bit value corresponding to a first program state P1 and the data latch 144 stores a bit value corresponding to a third program state P3. When the memory cells MC32 and MC34 are verify-passed after the predetermined program loops, the nonvolatile memory device 100 changes a bit value stored at the data latch 142 from a bit value corresponding to the first program state P1 to a bit value corresponding to an erase state E and a bit value stored at the data latch 144 from a bit value corresponding to the third program state P3 to a bit value corresponding to the second program state P2.

In a next program loop, the nonvolatile memory device 100 inhibits programming for memory cells MC31 and MC32 corresponding to first and second data latches 141 and 142 each including a bit value of an erase state E. That is, that a bit value of a data latch is changed into a bit value corresponding to an erase state E indicates that completion of a programming for a memory cell corresponding thereto.

Figure 13:
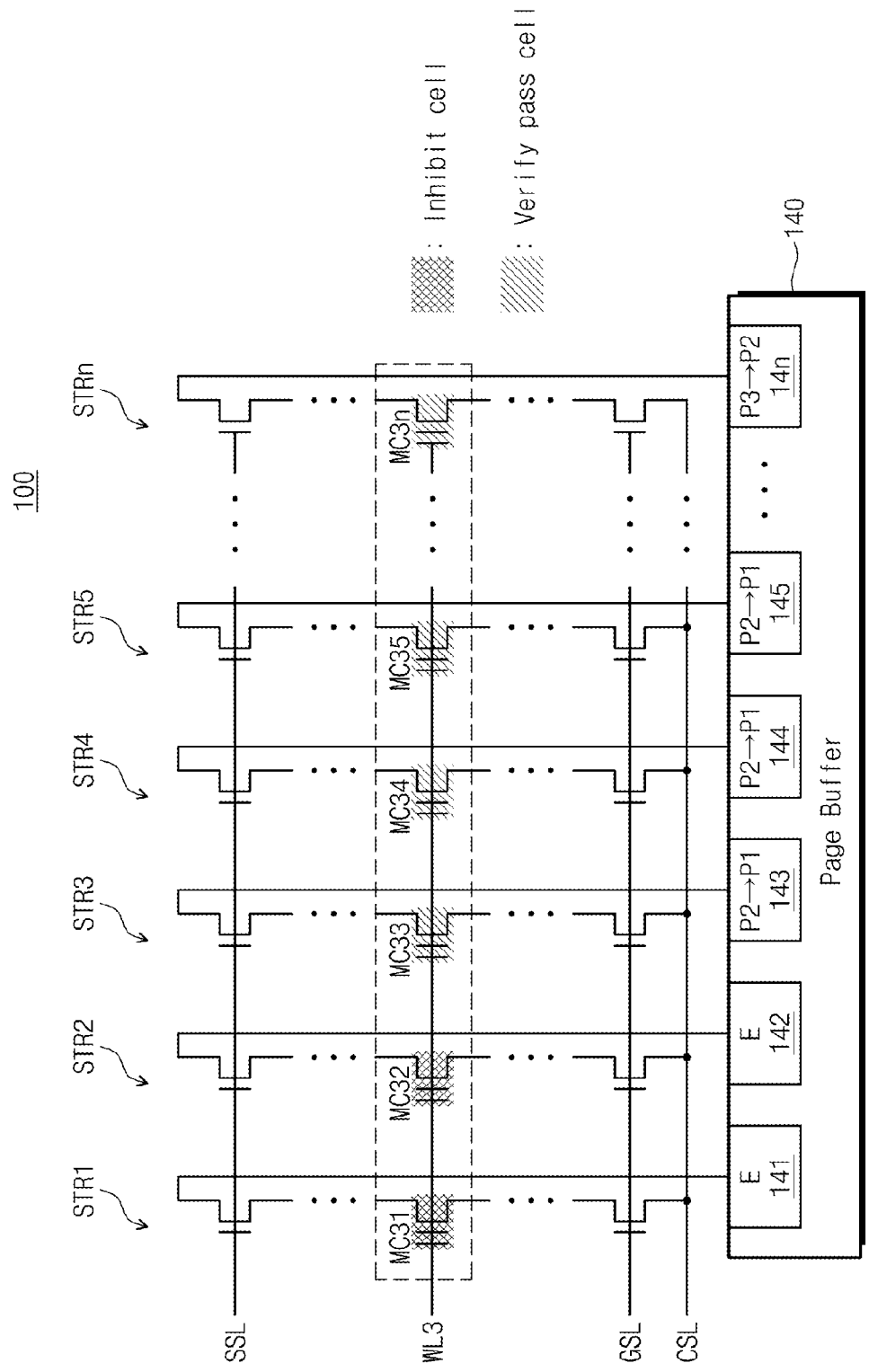

Referring to FIGS. 1, 6, and 13, the first and second memory cells MC31 and MC32 program-completed may be program-inhibited in subsequent program loops. In a verification step of a next program loop, memory cells MC33, MC34, MC35, and MC3n are verify-passed. In this case, the nonvolatile memory device 100 changes bit values of data latches 143, 144, 145, and 14n corresponding to memory cells MC33, MC34, MC35, and MC3n. For example, a bit value of the third data latch 143 is changed into a bit value corresponding to a first program state P1 from a bit value corresponding to a second program state P2 and a bit value of the third fourth latch 144 into a bit value corresponding to the first program state P1 from a bit value corresponding to the second program state P2. A bit value of the fifth data latch 145 is changed into a bit value corresponding to the first program state P1 from a bit value corresponding to the second program state P2 and a bit value of the n-th fourth latch 14n into a bit value corresponding to the second program state P2 from a bit value corresponding to the third program state P3.

Figure 14:
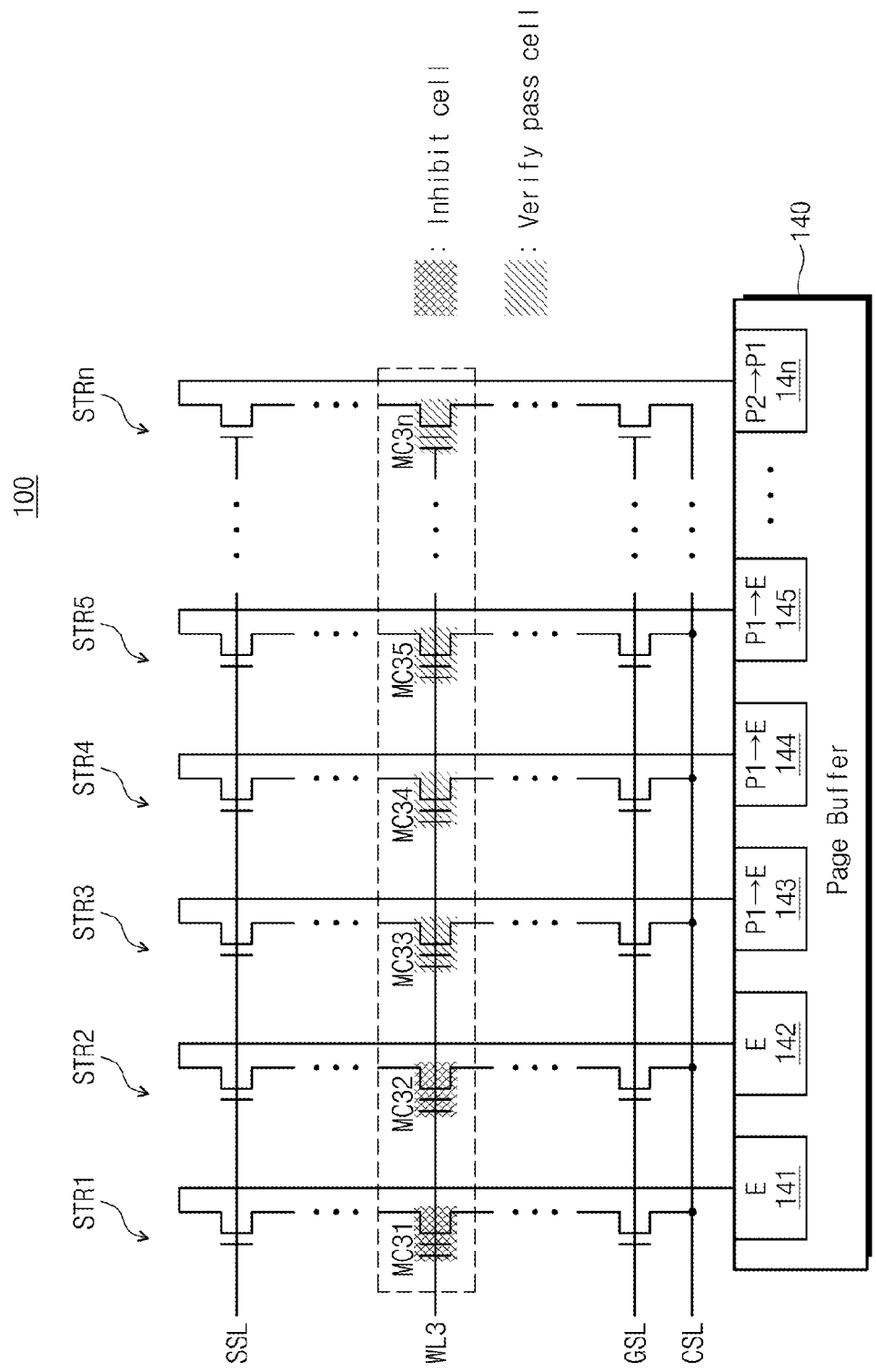

Likewise, referring to FIGS. 1, 6, and 14, in a verification step of a program loop following a program loop shown in FIG. 13, memory cells MC33, MC34, MC35, and MC3n are verify-passed, and the nonvolatile memory device 100 changes bit values of the data latches 143, 144, 145, and 14n.

As described above, the nonvolatile memory device 100 according to an embodiment of the inventive concepts executes a plurality of program loops such that each of memory cells has one of a plurality of program states. At this time, the nonvolatile memory device 100 verifies at least two program states using a verification voltage. Program completion conditions of the at least two program states are different from each other. For example, the numbers of events that memory cells of which the target program states are the at least two program states are verify-passed or are determined to be an off cell by a verification voltage are different from each other.

That is, as described above, the number of events that a verification voltage is applied is reduced, thereby making it possible to improve the performance of the nonvolatile memory device 100.

Figure 15:
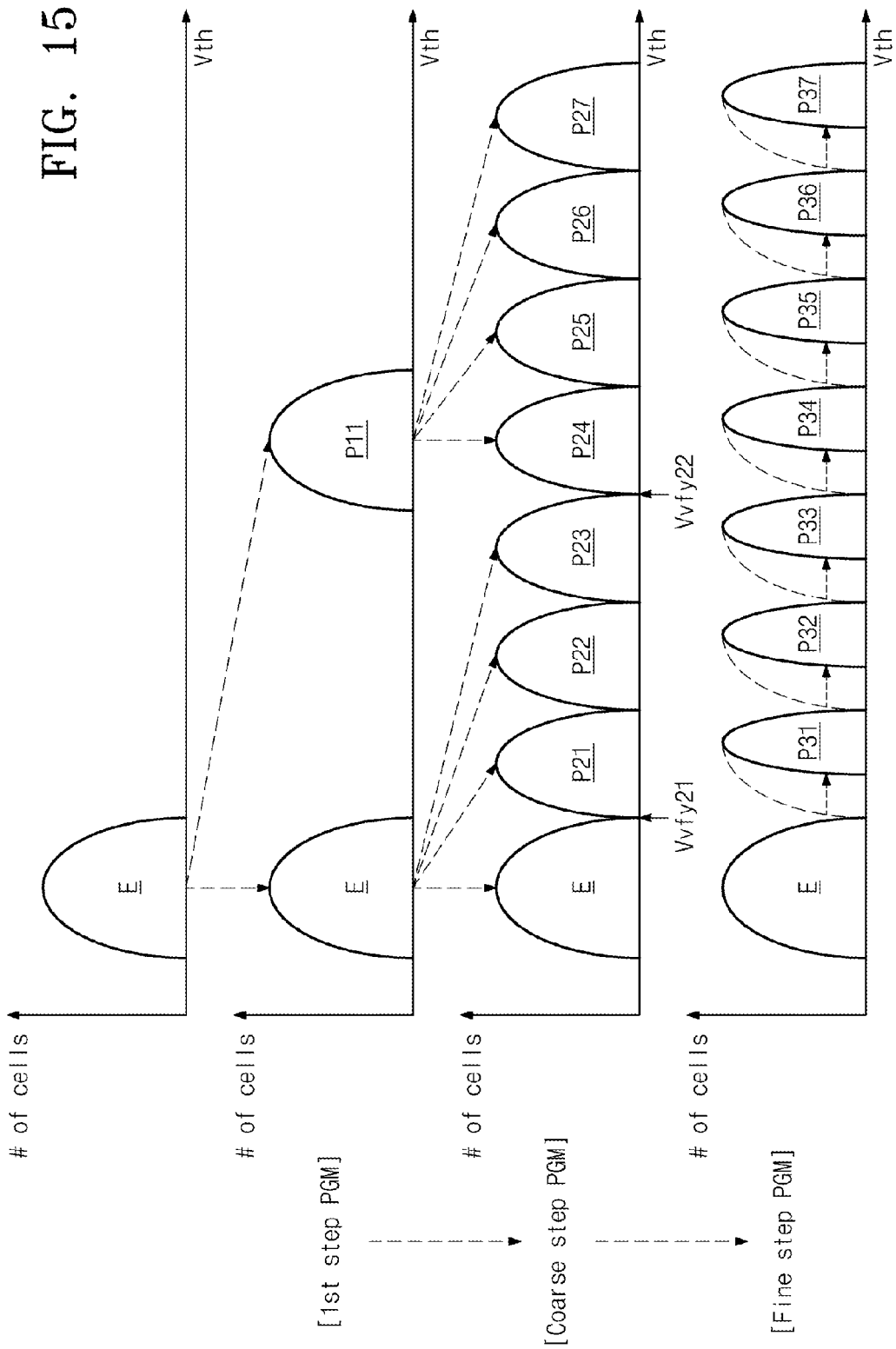
FIGS. 15 and 16 are diagrams for reference in describing a program operation of a nonvolatile memory device according to another embodiment of the inventive concepts.
Figure 16:
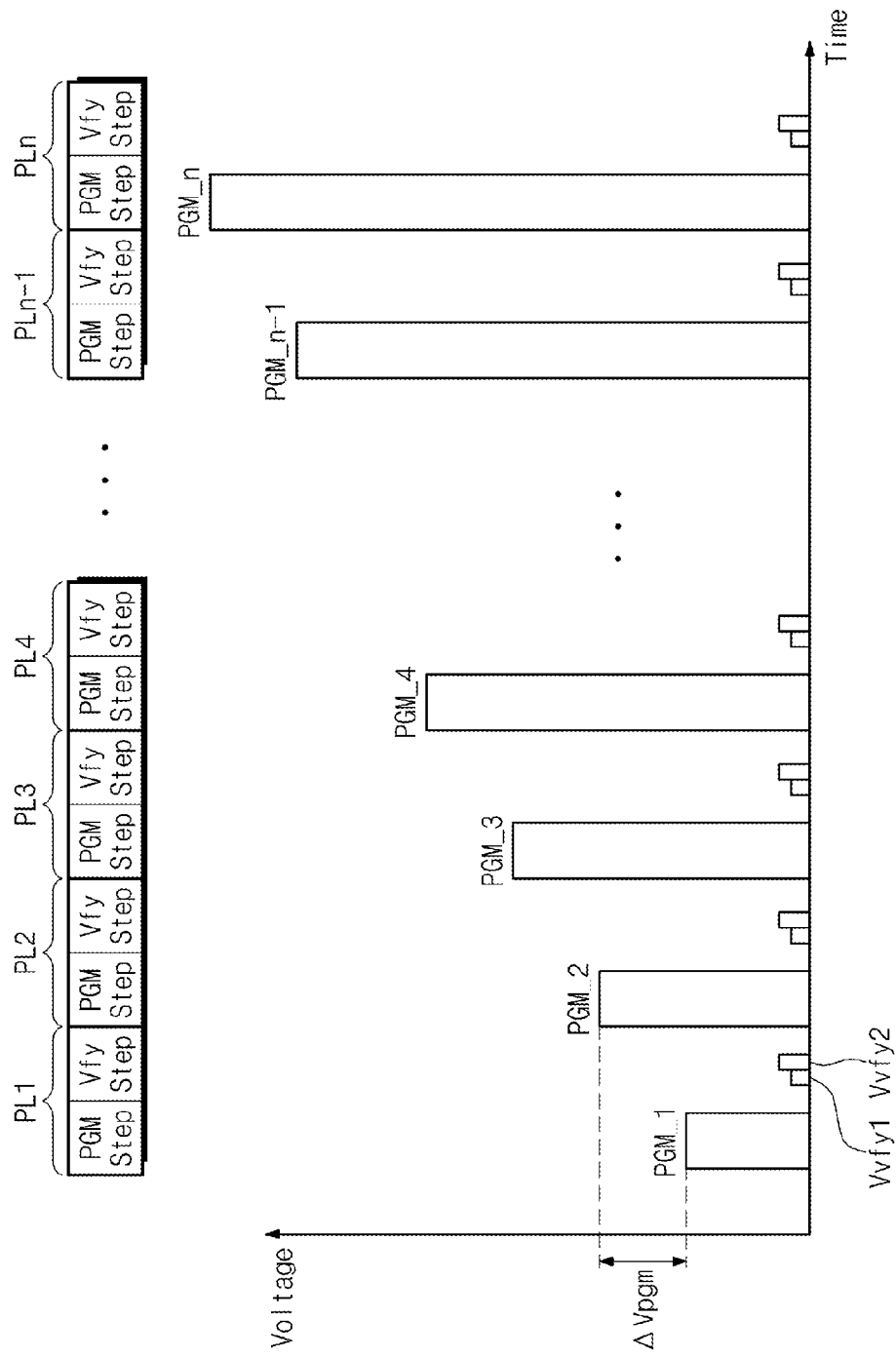

FIGS. 15 and 16 are diagrams for describing a program operation of a nonvolatile memory device according to another embodiment of the inventive concepts. It is assumed that a nonvolatile memory device 100 includes multi-level cells (MLC or TLC) each storing 3-bit data. However, the scope and spirit of the inventive concepts may not be limited thereto.

The nonvolatile memory device 100 performs a first program operation such that a plurality of memory cells have an erase state E or a program state P11. Afterwards, the nonvolatile memory device 100 performs coarse programming such that memory cells having the erase state E have one of the erase state E and program states P21 through P23 and memory cells having the first program state P11 have one of program states P24 through P27.

Afterwards, the nonvolatile memory device 100 performs fine programming such that the program states P21 through P27 are distributed like program states P31 through P37.

In exemplary embodiments, a program manner of a nonvolatile memory device 100 described with reference to FIGS. 5 through 14 may be applied to coarse programming. For example, as illustrated in FIG. 16, the nonvolatile memory device 100 executes a plurality of program loops PL1 through PLn and programs the memory cells with one of the erase state E and the program states P21 through P27.

In a verification step of each of a plurality of program loops PL1 through PLn, the nonvolatile memory device 100 applies first and second verification voltages Vvfy1 and Vvfy2 to a selected word line to verify program states of the memory cells.

For example, memory cells of which the target program states are program states P21, P22, and P23 are verified by the first verification voltage Vvfy1, and memory cells of which the target program states are program states P24, P25, P26, and P27 are verified by the second verification voltage Vvfy2. Similarly with that described with reference to FIGS. 5 through 14, memory cells having different target program states are verified using the same verification voltage, but their program completion conditions are different from each other. The following table 2 shows program completion conditions (i.e., program-inhibit conditions) of program states P21 through P27.

TABLE 2

| Target program state | Reference verification voltage | Verification pass count by reference verification voltage |
|---|---|---|
| E | — | — |
| P21 | Vvfy1 | 1 |
| P22 | Vvfy1 | 2 |
| P23 | Vvfy1 | 3 |
| P24 | Vvfy2 | 1 |
| P25 | Vvfy2 | 2 |
| P26 | Vvfy2 | 3 |
| P27 | Vvfy2 | 4 |

Referring to the table 2, the program states P21, P22, and P23 are verified using a first verification voltage Vvfy1, but their verification pass counts by the first verification voltage Vvfy1 are different from each other. That is, when verify-passed once by the first verification voltage Vvfy1, the program state P21 is program-inhibited in a next program loop. In contrast, when verify-passed three times by the first verification voltage Vvfy1, the program state P23 is program-inhibited in a next program loop.

Likewise, program states P24, P25, P26, and P27 are verified by the second verification voltage Vvfy2, but their verification pass counts by the second verification voltage Vvfy2 are different from each other.

In detail, it is assumed that a memory cell of which the target program state is a program state P27 is programmed. In this case, when the memory cell is determined to be an off cell by the second verification voltage Vvfy2, the nonvolatile memory device 100 changes a bit value of a data latch corresponding to a verify-passed memory cell from a bit value of the program state P27 to a bit value of the program state P26. Afterwards, whenever the memory cell is verify-passed by the second verification voltage Vvfy2, the nonvolatile memory device 100 sequentially changes a bit value of a data latch of a verify-passed memory cell: P27→P26→P25→P24.

In exemplary embodiments, when a memory cell is verify-passed and a bit value of a data latch corresponding to the verify-passed memory cell is a bit value of the program state P24, the nonvolatile memory device 100 changes a bit value of a data latch from a bit value of the program state P24 to a bit value of the erase state E. The memory cell is program-inhibited in subsequent program loops.

That is, the nonvolatile memory device 100 changes bit values of data latches corresponding to verify-passed memory cells into bits corresponding to lower program states. When a threshold voltage distribution of a lower program state is lower than a reference verification voltage, a bit value of a data latch corresponding to a verify-passed program state is changed into a bit value corresponding to an erase state E. In exemplary embodiments, the lower program state indicates a program state having a threshold voltage distribution range smaller than a program state corresponding to a bit value stored at a data latch.

Program and program verification methods of a nonvolatile memory device 100 are exemplarily described with reference to FIGS. 15 and 16. However, the scope and spirit of the inventive concepts may not be limited thereto. Although not shown in figures, for example, during a first program operation 1st step PGM, the nonvolatile memory device 100 programs a plurality of memory cells such that four threshold voltage distributions are formed. In this case, the nonvolatile memory device 100 programs memory cells, based on the program and program verification methods described with reference to FIGS. 5 through 14. Also, during coarse programming, the nonvolatile memory device 100 programs a plurality of memory cells using two or more verification voltages. In addition, during fine programming, the nonvolatile memory device 100 programs a plurality of memory cells using seven verification voltages. The seven verification voltages are verification voltages for verifying memory cells of which the target program states are program states P31 through P37.

The program and program verification methods described with reference to FIGS. 15 and 16 are exemplary. The program and program verification methods may be variously changed or modified according to the number of bits stored at a memory cell and the number of target threshold voltage distributions.

As described above, the nonvolatile memory device 100 programs a plurality of memory cells with one of a plurality of program states. At this time, the nonvolatile memory device 100 verifies at least two program states of the plurality of program states using a verification voltage. At this time, counts of the at least two program states verify-passed by the verification voltage are different from each other. That is, the number of events that the verification voltage is applied decreases when multi-level cells storing a plurality of bits are programmed, thereby making it possible to improve the performance of a nonvolatile memory device.

A program verification method described with reference to FIGS. 5 through 16 is exemplary, and the scope and spirit of the inventive concepts may not be limited thereto. The nonvolatile memory device 100 programs a plurality of memory cells to have one of a plurality of threshold voltage distributions. The nonvolatile memory device 100 performs verifying about threshold voltage distributions of the plurality of memory cells, based on a plurality of verification voltages. At this time, at least two of the plurality of threshold voltage distributions are verified by a verification voltage, but program completion conditions of the at least two threshold voltage distributions are different from each other. That is, the scope and spirit of the inventive concepts may not be limited to a program verification method described with reference to FIGS. 5 through 16. For example, in a verification step, one or more verification voltages are applied, and at least two threshold voltage distributions or program states are verified using one of the one or more verification voltages.

Figure 17:
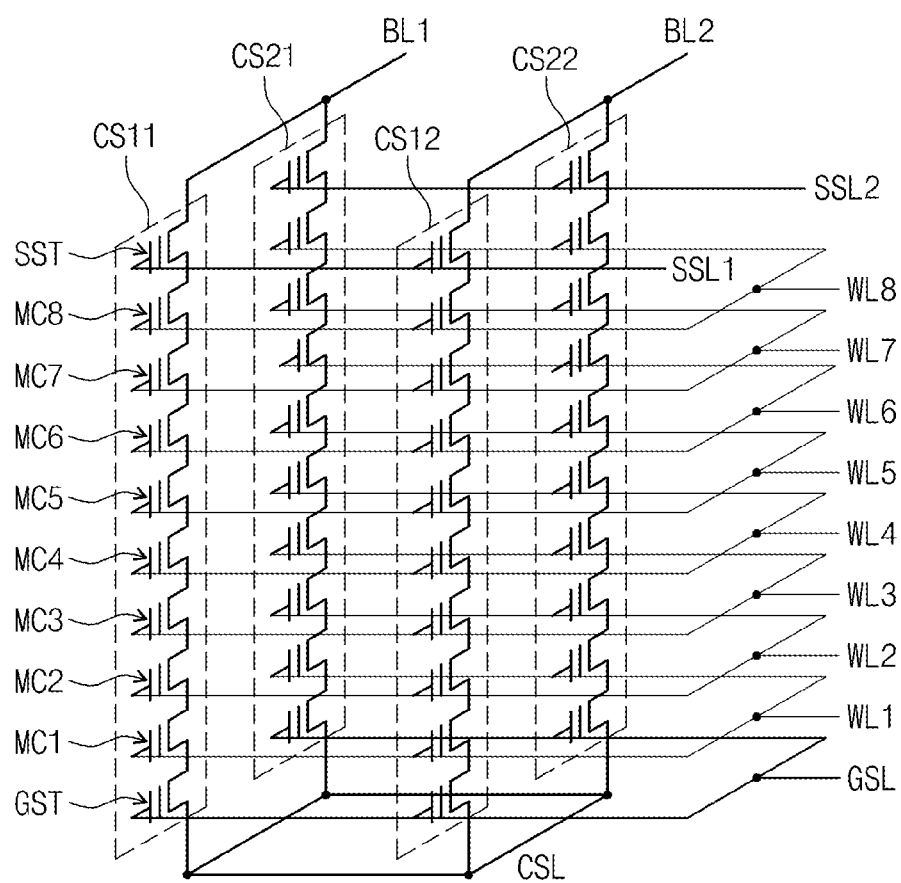
FIG. 17 is a circuit diagram schematically illustrating a memory block according to still another embodiment of the inventive concepts.

FIG. 17 is a circuit diagram schematically illustrating a memory block according to still another embodiment of the inventive concepts. Illustrated in FIG. 17 is a first memory block BLK1. However, the scope and spirit of the inventive concepts may not be limited thereto. The remaining memory blocks may also have the same structure as the first memory block BLK1. However, the scope and spirit of the inventive concepts may not be limited thereto.

Referring to FIG. 17, the first memory block BLK1 includes a plurality of cell strings CS11, CS12, CS21 and CS22. The cell strings CS11, CS12, CS21 and CS22 are arranged along a row direction and a column direction to form rows and columns.

Each of the cell strings CS11, CS12, CS21 and CS22 may include a plurality of cell transistors. The cell transistors includes a string select transistor SST, a plurality of memory cells MC1~MC8 and a ground select transistor GST. The string select transistor SST is connected to a string select line SSL. The string select line SSL may be divided into first and second string select lines SSL1 and SSL2. The memory cells MC1~MC8 are connected to word lines WL1~WL8 respectively. Word lines having the same height are connected in common. The ground select transistor GST is connected to a ground select line GSL. Each cell string is connected between a bit line BL and a common source line CSL. That is, the string select transistor SST is connected to the bit line BL and the ground select transistor GST is connected to the common source line CSL.

Cell strings disposed in the same column are connected to the same bit line. For example, the cell strings CS11 and CS21 are connected to a first bit line BL1. The cell strings CS12 and CS22 are connected to a second bit line BL2.

Cell strings disposed in the same row are connected to the same string select line. For example, the cell strings CS11 and CS12 are connected to the first string select line SSL1. The cell strings CS21 and CS22 are connected to the second string select line SSL2.

Each of the cell strings CS11, CS12, CS21 and CS22 is stacked in a direction perpendicular to a substrate (not shown). For example, the ground select transistor GST, the memory cells MC1-MC8 and the string select transistor SST may be stacked in the direction perpendicular to the substrate to be formed. In exemplary embodiments, the memory cells MC1-MC8 may be constituted by charge trap flash (CTF) memory cells.

The inventive concept is not limited to the first memory block BLK1 illustrated in FIG. 17. For example, the number of rows of cell strings may be increased or reduced relative to that of FIG. 17. As the number of rows of cell strings is changed, the number of string select lines or ground select lines connected to rows of the cell strings and the number of cell strings connected to one bit line may also be changed.

The number of columns of cell strings may be increased or reduced relative to that of FIG. 17. As the number of columns of cell strings is changed, the number of bit lines connected to columns of the cell strings and the number of cell strings connected to one string select line may also be changed.

A height of cell strings may be increased or reduced relative to that of FIG. 17. For example, the number of memory cells being stacked in each cell string may be increased or reduced. As the number of memory cells being stacked in each cell string is changed, the number of word lines may also be changed.

The number of string select transistors and/or ground select transistors being provided each cell string may be increased relative to that of FIG. 17. For example, as the number of string select transistors or ground select transistors being provided each cell string is changed, the number of string select lines or ground select lines may also be changed. In the case that the number of string select lines or ground select lines is increased, the string select lines or the ground select lines may be stacked in the same form as the memory cells MC1-MC8.

In exemplary embodiments, write and read operations may be performed by a row unit of the cell strings CS11, CS12, CS21 and CS22. The cell strings CS11, CS12, CS21 and CS22 may be selected by one row unit by the string select lines SSL1 and SSL2.

In a selected row of the cell strings CS11, CS12, CS21 and CS22, write and read operations may be performed by a page unit. The page may be one row of memory cells connected to one word line. Alternatively, the page may be a unit of data stored in one row of memory cells connected to one word line. In a selected row of the cell strings CS11, CS12, CS21 and CS22, memory cells may be selected by a page unit by the word lines WL1-WL8.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 18:
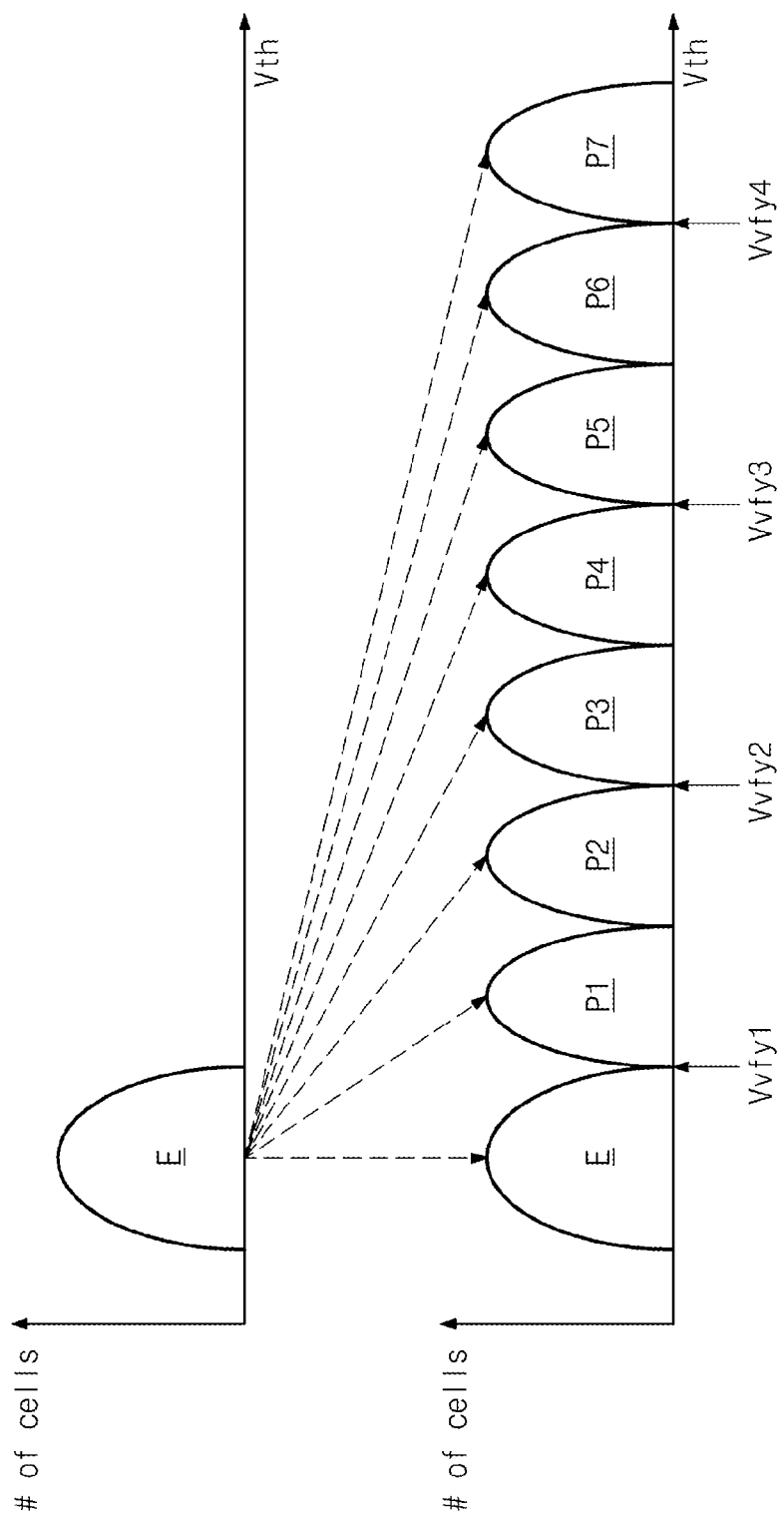
FIGS. 18 and 19 are diagrams for reference in describing an example of a method of programming a memory block shown in FIG. 17.
Figure 19:
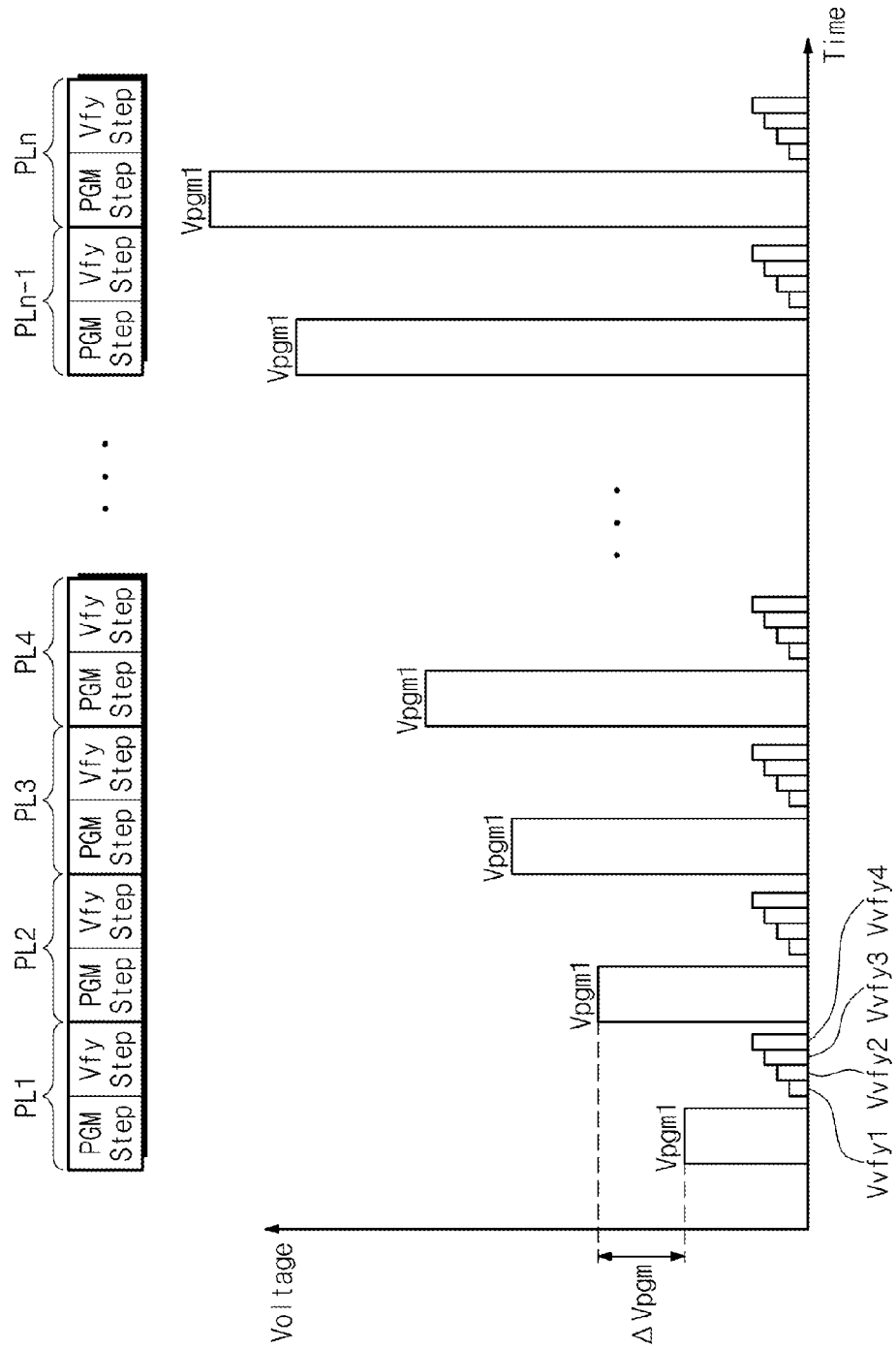

FIGS. 18 and 19 are diagrams for reference in describing a method of programming a first memory block shown in FIG. 17. For brevity of description, it is assumed that memory cells of a first memory block BLK1 are triple level cells (TLC) each storing three bits. However, the scope and spirit of the inventive concepts is not limited thereto.

Referring to FIGS. 1 and 17 through 19, a nonvolatile memory device 100 programs a plurality of memory cells having an erase state E such that each of the plurality of memory cells has one of the erase state E and first through seventh program states P1 through P7. This programming is referred to as one-shot programming.

The nonvolatile memory device 100 verifies program states of memory cells using first through fourth verification voltages Vvfy1 through Vvfy4. For example, the nonvolatile memory device 100, as illustrated in FIG. 19, executes a plurality of program loops PL1 through PLn to program a plurality of memory cells. Each of the plurality of program loops PL1 through PLn includes a program step and a verification step. In the program step, the nonvolatile memory device 100 supplies program voltages PGM_1 through PGM_n. In the verification step, the nonvolatile memory device 100 verifies program states of memory cells using the first through fourth verification voltages Vvfy1 through Vvfy4.

The nonvolatile memory device 100 verifies program states of memory cells of which the target program states are a first or second program state P1 or P2, using the first verification voltage Vvfy1. The nonvolatile memory device 100 verifies program states of memory cells of which the target program states are a third or fourth program state P3 or P4, using the second verification voltage Vvfy2. The nonvolatile memory device 100 verifies program states of memory cells of which the target program states are a fifth or sixth program state P5 or P6, using the third verification voltage Vvfy3. The nonvolatile memory device 100 verifies program states of memory cells of which the target program states are seventh program states P7, using the fourth verification voltage Vvfy4.

As described with reference to FIGS. 5 through 16, when a memory cell is verify-passed by a reference verification voltage, the nonvolatile memory device 100 sequentially changes a bit value of a data latch corresponding to the verify-passed memory cell. Alternatively, when a memory cell is verify-passed by a reference verification voltage, the nonvolatile memory device 100 changes a bit value, based on a bit value currently stored at a data latch corresponding to the verify-passed memory cell.

At this time, program completion conditions (i.e., program-inhibit conditions) of memory cells are different from each other. For example, the following table 3 shows program completion conditions of memory cells of which the target program states are program states P1 through P7.

TABLE 3

| Target program state | Reference verification voltage | Verification pass count by reference verification voltage |
|---|---|---|
| E | — | — |
| P1 | Vvfy1 | 1 |
| P2 | Vvfy1 | 2 |
| P3 | Vvfy2 | 1 |
| P4 | Vvfy2 | 2 |
| P5 | Vvfy3 | 1 |
| P6 | Vvfy3 | 2 |
| P7 | Vvfy4 | 1 |

Referring to the table 3, memory cells of which the target program states are a first program state P1 are verified by a first verification voltage Vvfy1. However, memory cells that are verify-passed once by the first verification voltage Vvfy1 (i.e., memory cells determined to be an off cell) are program-inhibited.

Memory cells of which the target program states are a second program state P2 are verified by the first verification voltage Vvfy1, and the memory cells are program-inhibited when the memory cells are verify-passed two times by the first verification voltage Vvfy1 (i.e., memory cells determined to be an off cell).

Likely, Memory cells of which the target program states are a third program state P3 are verified by a second verification voltage Vvfy2, and the memory cells are program-inhibited when the memory cells are verify-passed once by the second verification voltage Vvfy2 (i.e., memory cells determined to be an off cell).

Memory cells of which the target program states are a fourth program state P4 are verified by the second verification voltage Vvfy2, and the memory cells are program-inhibited when memory cells are verify-passed two times by the second verification voltage Vvfy2 (i.e., memory cells determined to be an off cell).

As described above, the nonvolatile memory device 100 programs a plurality of memory cells such that each of the plurality of memory cells has one of a plurality of program states, and at least two program states of the plurality of program states are verified using a verification voltage. At this time, counts of the at least two program states verify-passed by a verification voltage are different from each other. That is, a time taken to verify memory cells is reduced because it is unnecessary to apply verification voltages corresponding to the plurality of program states. This means that the performance of a nonvolatile memory device is improved.

Figure 20:
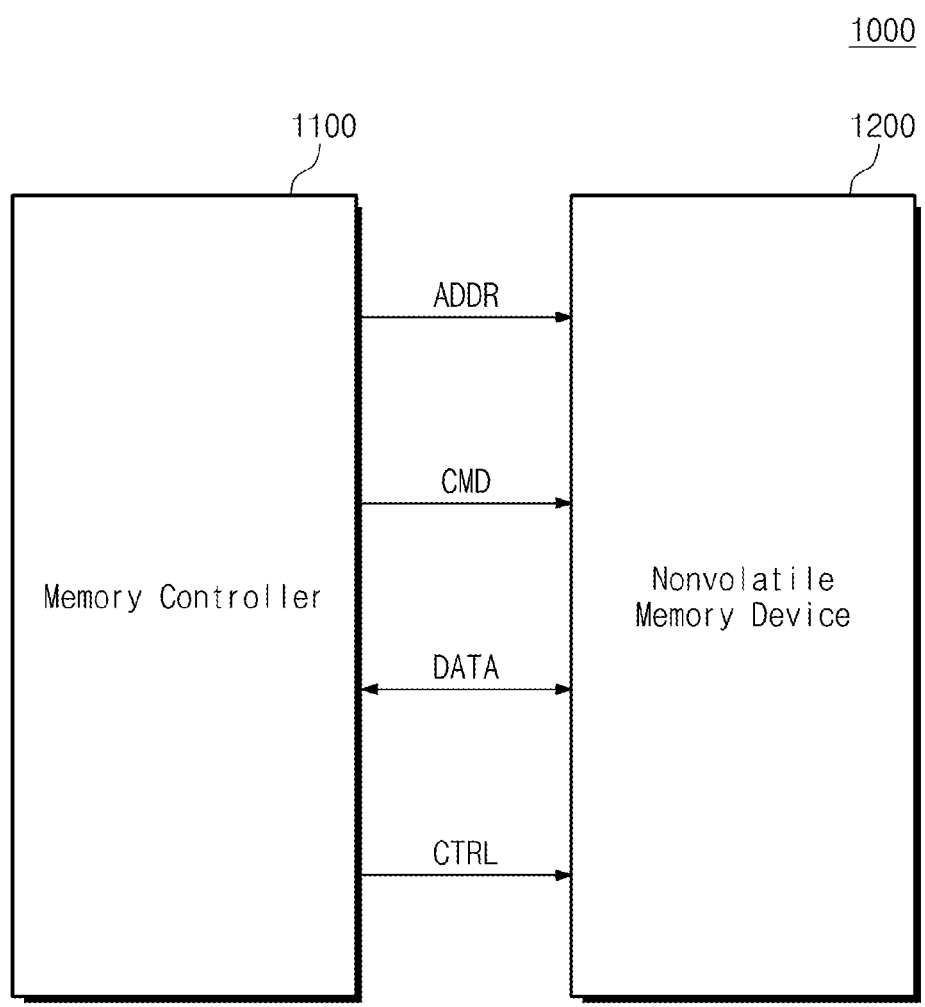
FIG. 20 is a block diagram schematically illustrating a nonvolatile memory system to which a nonvolatile memory device according to an embodiment of the inventive concepts is applied.

FIG. 20 is a block diagram schematically illustrating a nonvolatile memory system to which a nonvolatile memory device according to an embodiment of the inventive concepts is applied. Referring to FIG. 20, a nonvolatile memory system 1000 contains a memory controller 1100 and a nonvolatile memory device 1200.

The memory controller 1100 controls the nonvolatile memory device 1200 according to a request of an external device (e.g., host or application processor). For example, the memory controller 1100 sends an address ADDR, a command CMD, and a control signal CTRL to the nonvolatile memory device 1200 to read data stored at the nonvolatile memory device 1200. The nonvolatile memory device 1200 transmits data to the memory controller 1100 in response to signals from the memory controller 1100.

The memory controller 1100 sends an address ADDR, a command CMD, a control signal CTRL, and data to the nonvolatile memory device 1200 to store the data at the nonvolatile memory device 1200. The nonvolatile memory device 1200 stores data in response to signals from the memory controller 1100. At this time, the nonvolatile memory device 1200 stores data depending on a program method or a program verification method described with reference to FIGS. 1 through 19.

Figure 21:
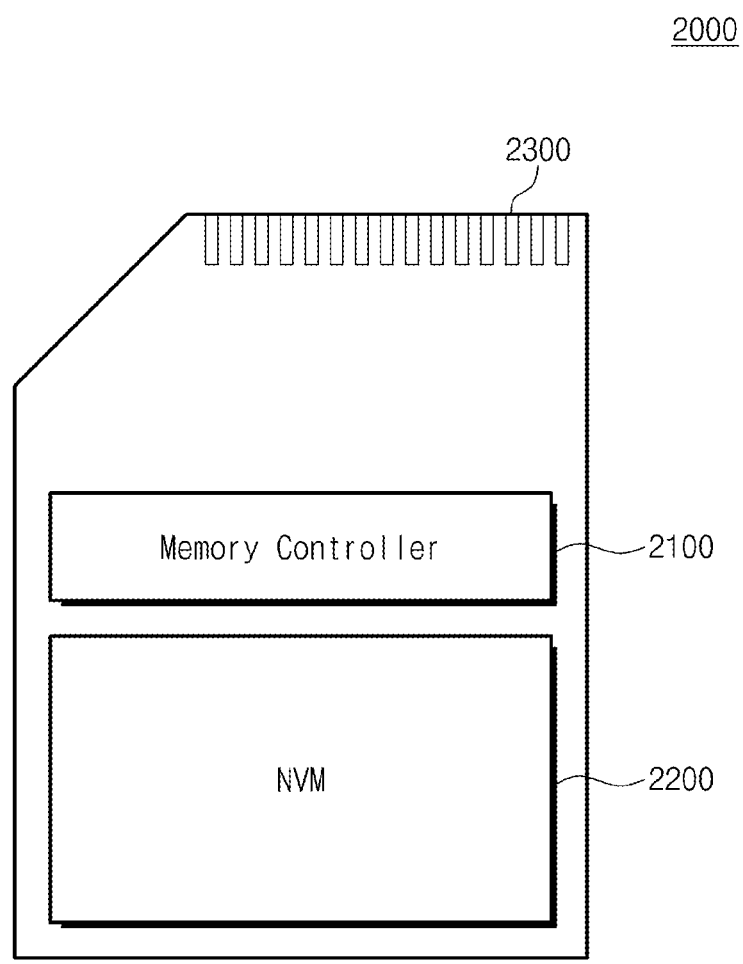
FIG. 21 is a block diagram schematically illustrating a memory card system including a nonvolatile memory system according to embodiments of the inventive concepts.

FIG. 21 is a block diagram schematically illustrating a memory card system including a nonvolatile memory system according to embodiments of the inventive concepts. Referring to FIG. 21, a memory card system 2000 contains a memory controller 2100, a nonvolatile memory 2200, and a connector 2300.

The memory controller 2100 is connected to the nonvolatile memory 2200. The memory controller 2100 is configured to access the nonvolatile memory 2200. For example, the memory controller 2100 may be adapted to control an overall operation of the nonvolatile memory 2200 including, but not limited to, a read operation, a write operation, an erase operation, and a background operation. The memory controller 2100 provides an interface between the nonvolatile memory 2200 and a host. The memory controller 2100 is configured to drive firmware for controlling the nonvolatile memory 2200.

In exemplary embodiments, the memory controller 2100 may include components such as, but not limited to, a RAM, a processing unit, a host interface, a memory interface, and an error correction unit.

The memory controller 2100 communicates with an external device through the connector 2300. The memory controller 2100 communicates with an external device according to a particular communication protocol. For example, the memory controller 2100 may communicate with the external device through at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire. In exemplary embodiments, the connector 2300 may be defined by at least one of the communication protocols.

In exemplary embodiments, the nonvolatile memory 2200 may be implemented with a variety of nonvolatile memory devices, such as, but not limited to, an EPROM (Electrically Erasable and Programmable ROM), a NAND flash memory, a NOR flash memory, a PRAM (Phase-change RAM), an ReRAM (Resistive RAM), a FRAM (Ferroelectric RAM), and an STT-MRAM (Spin-Torque Magnetic RAM).

The memory controller 2100 or the nonvolatile memory 2200 may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the nonvolatile memory 2200 may include a plurality of nonvolatile memory chips, which are implemented in one of the above-described packaging technologies.

In exemplary embodiments, the memory controller 2100 and the nonvolatile memory 2200 may be integrated in a single semiconductor device. The memory controller 2100 and the nonvolatile memory 2200 may be integrated in a single semiconductor device to form a solid state drive (SSD). The memory controller 2100 and the nonvolatile memory 2200 may be integrated in a single semiconductor device to form a memory card such as, but not limited to, a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

In exemplary embodiments, the nonvolatile memory 2200 may program data according to a control of the memory controller 2100. At this time, the nonvolatile memory 2200 may program data, based on a program method or a program verification method described with reference to FIGS. 5 through 19.

Figure 22:
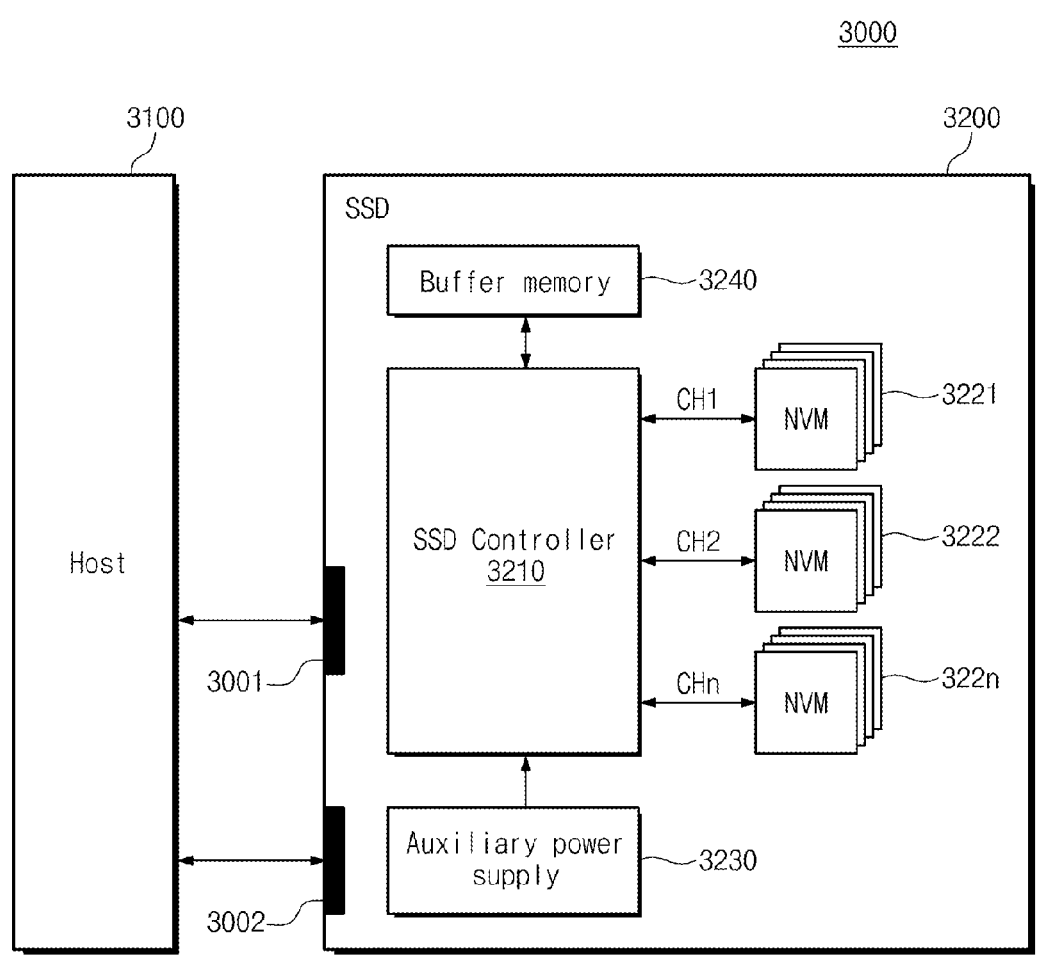
FIG. 22 is a block diagram illustrating a solid state drive including a nonvolatile memory system according to an embodiment of the inventive concepts.

FIG. 22 is a block diagram illustrating a solid state drive including a nonvolatile memory system according to an embodiment of the inventive concepts. Referring to FIG. 22, a solid state drive (SSD) system 3000 comprises a host 3100 and an SSD 3200. The SSD 3200 exchanges signals SGL with the host 3100 through the host interface 3001 and is supplied with a power through a power connector 3002. The SSD 3200 comprises a plurality of flash memories 3221 to 322n, an SSD controller 3210, an auxiliary power supply 3230, and a buffer memory 3240.

The SSD controller 3210 controls the flash memories 3221 to 322n in response to a signal SIG from the host 3100. For example, the signal SIG may be a signal that is based on interfaces of the host 3100 and the SSD 3200. For example, the signal SIG may be a signal defined in compliance with at least one of various interface protocols such as, but not limited to, universal serial bus (USB, multimedia card (MMC), eMMC (embedded MMC), peripheral component interconnection (PCI), PCI-express (PCI-E), advanced technology attachment (ATA), a serial-ATA protocol, parallel-ATA, small computer small interface (SCSI), enhanced small disk interface (ESDI), integrated drive electronics (IDE), UFS (Universal Flash Storage), WiFi, Bluetooth, NVMe, and Firewire.

The auxiliary power supply 3230 is connected to the host 3100 via the power connector 3002. The auxiliary power supply 3230 is charged by a power PWR from the host 3100. When a power is not smoothly supplied from the host 3100, the auxiliary power supply 3230 powers the SSD system 3000. The auxiliary power supply 3230 may be placed inside or outside the SSD 3200. For example, the auxiliary power supply 3230 may be put on a main board to supply an auxiliary power to the SSD 3200.

The buffer memory 3240 acts as a buffer memory of the SSD 3200. For example, the buffer memory 3240 temporarily stores data received from the host 3100 or from the flash memories 3221 to 322n, or it temporarily stores metadata (e.g., mapping tables) of the flash memories 3221 to 322n. The buffer memory 3240 may include volatile memories such as DRAM, SDRAM, DDR SDRAM, LPDDR SDRAM, SRAM, and so on or nonvolatile memories such as FRAM ReRAM, STT-MRAM, PRAM, and so on.

In exemplary embodiments, the nonvolatile memories 3221 through 322n may store data or output stored data according to a control of the SSD controller 3210. The nonvolatile memories 3221 through 322n may be implemented with a nonvolatile memory device 100 described with reference to FIGS. 5 through 19 and store data depending on a program method or a program verification method described with reference to FIGS. 5 through 19.

Figure 23:
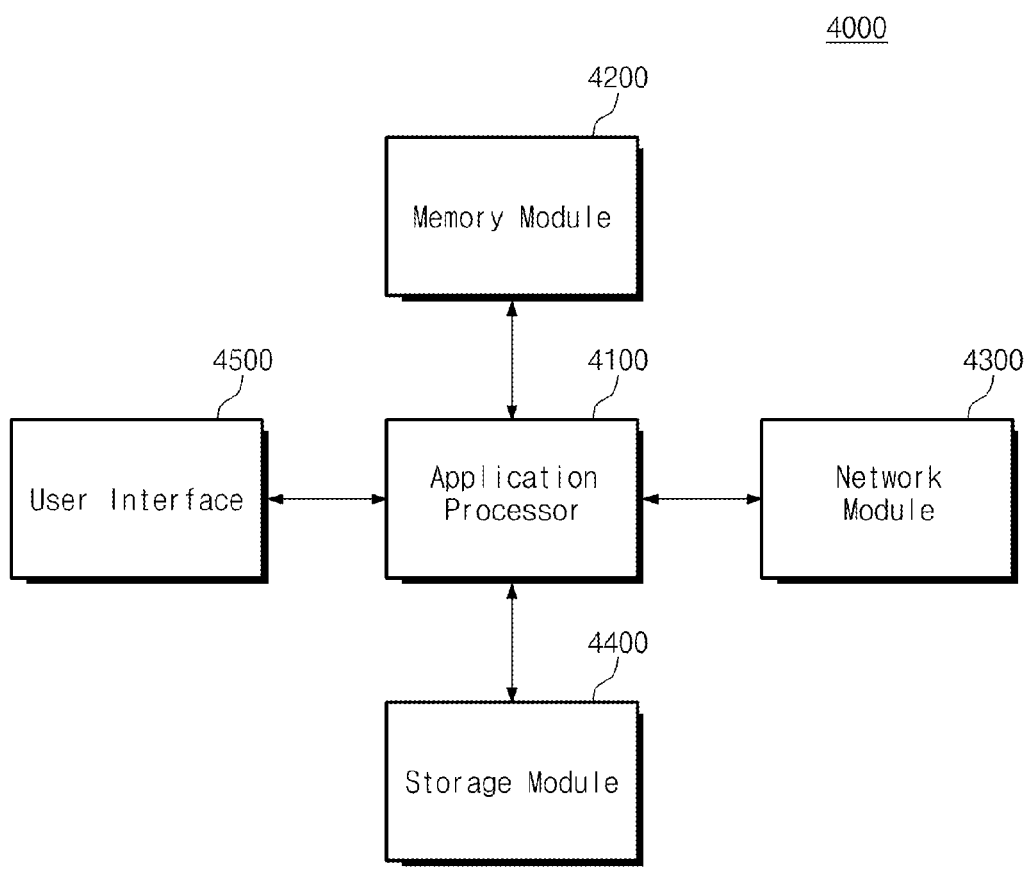
FIG. 23 is a block diagram schematically illustrating a user system including a nonvolatile memory system according to an embodiment of the inventive concepts.

FIG. 23 is a block diagram schematically illustrating a user system including a nonvolatile memory system according to an embodiment of the inventive concepts. Referring to FIG. 23, a user system 4000 includes an application processor 4100, a memory module 4200, a network module 4300, a storage module 4400, and an input interface 4500.

The application processor 4100 drives components of the user system 4000, an operating system, and so on. For example, the application processor 4100 may include controllers for controlling components of the user system 4000, graphics engines, a variety of interfaces, and so on. The application processor 4100 may be implemented with a system-on-chip (SoC).

The memory module 4200 operates as a main memory, a working memory, a buffer memory, or a cache memory of the user system 4000. The memory module 4200 may be implemented with a volatile random access memory, such as DRAM (Dynamic Random Access Memory), SDRAM (Synchronous DRAM), DDR SDRAM (Double Date Rate SDRAM), DDR2 SDRAM, DDR3 SDRAM, LPDDR DRAM, LPDDR2 DRAM, or LPDDR3 DRAM or a nonvolatile random access memory, such as PRAM (Phase-change RAM), MRAM (Magnetic RAM), RRAM (Resistive RAM), or FRAM (Ferroelectric RAM). In exemplary embodiments, the application processor 4100 and the memory module 4200 are packed in a semiconductor package depending on the POP (Package on Package).

The network module 4300 communicates with external devices. For example, the network module 4300 may support wireless communications, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on. As another embodiment, the network module 4300 may be embedded in the application processor 4100.

The storage module 4400 stores data. For example, the storage module 4400 stores data received from the application processor 4100. Alternatively, the storage module 4400 provides the application processor 4100 with data stored therein. For example, the storage module 4400 may be implemented with a nonvolatile semiconductor memory device such as PRAM, MRAM, RRAM, NAND flash memory, NOR flash memory, or a three-dimensional NAND flash memory. In exemplary embodiments, the storage module 4400 may be implemented with a removable drive, such as a memory card of the user system 4000 or an external drive.

In exemplary embodiments, the storage module 4400 may include a plurality of nonvolatile memory devices, which store data depending on a program method or a program verification method described with reference to FIGS. 5 through 19.

The input interface 4500 may provide interfaces for providing data or commands to the application processor 4100 or for outputting data to an external device. For example, the input interface 4500 may include user input interfaces, such as a key board, a key pad, a button, a touch panel, a touch screen, a touch pad, a touch ball, a camera, a microphone, a Gyroscope, a vibration sensor, and a piezoelectric element. The input interface 4500 may include user output interfaces, such as an LCD (Liquid Crystal Display) device, an OLED (Organic Light Emitting Diode) display device, an AMOLED (Active Matrix OLED) display device, an LED, a speaker, and a motor.

According to embodiments of the inventive concepts, a nonvolatile memory device programs a plurality of memory cells to have one of a plurality of program states (or, a plurality of threshold voltage distributions) and verifies program states of the memory cells using a plurality of verification voltages. At this time, at least two of the plurality of program states (or, a plurality of threshold voltage distributions) are verified using a verification voltage, but program completion conditions (i.e., program-inhibit conditions) of the at least two program states are different from each other.

In detail, when a target program state of a first memory cell is a first program state and a target program state of a second memory cell is a second program state, program states of the first and second memory cells are verified using a first verification voltage. However, program completion conditions (i.e., program-inhibit conditions) of the at least two program states, that is, verification pass counts by the first verification voltage (i.e., the numbers of counts that a memory cell is determined to be an off cell) are different from each other.

Thus, when multi-level cells storing a plurality of bits are programmed, the number of verification voltages applied to verify each program state is reduced. That is, a nonvolatile memory device with improved performance and an operating method thereof are provided.

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A program verification method of a nonvolatile memory device which programs a plurality of memory cells connected to a word line, comprising:
   applying a plurality of verification voltages to the word line; and
   determining whether programming of memory cells, having different target threshold voltage distributions, from among the plurality of memory cells is completed based on one verification voltage among the plurality of verification voltages.

2. The program verification method of claim 1, wherein the determining includes:
   determining whether the memory cells having different target threshold voltage distributions are verify-passed, based on the one verification voltage; and
   determining whether programming of the memory cells having different target threshold voltage distributions is completed, based on a predetermined verification pass count.

3. The program verification method of claim 2, wherein the memory cells having different target threshold voltage distributions are verify-passed when the memory cells having different target threshold voltage distributions are read to be an off cell.

4. The program verification method of claim 2, wherein the determining whether the memory cells having different target threshold voltage distributions are verify-passed, based on the one verification voltage, includes:
   changing, when one of the memory cells having different target threshold voltage distributions is verify-passed, a bit value of a data latch corresponding to the verify-passed memory cell,
   wherein the bit value of the data latch is changed into one of a bit value corresponding to an erase state and bit values corresponding to the plurality of threshold voltage distributions.

5. The program verification method of claim 4, wherein the changing, when one of the memory cells having different target threshold voltage distributions is verify-passed, a bit value of a data latch corresponding to the verify-passed memory cell, includes:
   changing a bit value stored at the data latch based on the bit value stored at the data latch.

6. The program verification method of claim 4, wherein the changing, when one of the memory cells having different target threshold voltage distributions is verify-passed, a bit value of a data latch corresponding to the verify-passed memory cell, includes:
   sequentially changing a bit value stored at the data latch according to a predetermined order.

7. The program verification method of claim 2, further comprising program-inhibiting memory cells determined to be program-completed.

8. A program method of a nonvolatile memory device which includes a plurality of memory cells connected to a word line, comprising:
   sequentially executing a plurality of program loops such that the plurality of memory cells have a plurality of program states,
   wherein each of the plurality of program loops includes:
   a program step in which a program pulse is applied to the word line; and
   a verification step in which a plurality of verification voltages are applied to the word line to verify whether programming of the plurality of memory cells is completed,
   wherein whether programming of memory cells, having different target program states, from among the plurality of memory cells is completed is verified by one verification voltage among the plurality of verification voltages.

9. The program method of claim 8, wherein the verification step includes:
   determining whether the memory cells having different target program states are verify-passed, based on the one verification voltage.

10. The program method of claim 9, wherein program completion conditions of the memory cells having different target program states have verification pass counts that are variable according to the different target program states.

11. The program method of claim 9, wherein the verification step further includes:
   changing, when a verify-passed memory cell exists among the memory cells having different target program states, a bit value of a data latch corresponding to the verify-passed memory cell.

12. The program method of claim 11, wherein the changing, when a verify-passed memory cell exists among the memory cells having different target program states, a bit value of a data latch corresponding to the verify-passed memory cell, includes:
   changing the bit value of the data latch into one of a bit value corresponding to an erase state and bit values corresponding to the plurality of program states.

13. The program method of claim 12, wherein the changing, when a verify-passed memory cell exists among the memory cells having different target program states, a bit value of a data latch corresponding to the verify-passed memory cell, further includes:
   changing the bit value of the data latch according to a predetermined order.

14. The program method of claim 12, wherein the changing, when a verify-passed memory cell exists among the memory cells having different target program states, a bit value of a data latch corresponding to the verify-passed memory cell further includes:
   changing the bit value of the data latch into a bit value corresponding to a program state having a threshold voltage distribution lower than that of a program state corresponding to the bit value of the data latch.

15. The program method of claim 14, wherein the changing the bit value of the data latch into a bit value corresponding to a program state having a threshold voltage distribution higher than that of a program state corresponding to the bit value of the data latch includes:
   changing, when a threshold voltage distribution of the program state lower than the program state corresponding to the bit value of the data latch is lower than the one verification voltage, the bit value of the data latch into a bit value corresponding to the erase state.

16. The program method of claim 11, further comprising:
   program-inhibiting a memory cell, corresponding to a data latch of which the bit value is changed, when the changed bit value of the data latch is a bit value corresponding to an erase state.

17. A nonvolatile memory device, comprising:
   a memory cell array including a plurality of memory cells;
   a page buffer connected to the memory cell array through a plurality of bit lines and adapted to temporarily store a plurality of data bits to be stored at the plurality of memory cells;
   an address decoder connected to the memory cell array through a plurality of word lines and adapted to select at least one of the plurality of word lines; and
   a control logic and voltage generator block adapted to control programming such that memory cells connected to the selected word line have target program states corresponding to the plurality of data bits temporarily stored at the page buffer,
   wherein the control logic and voltage generator block applies a plurality of verification voltages to the selected word line to determine whether programming of the memory cells connected to the selected word line is completed, and
   wherein the control logic and voltage generator block determines whether programming of memory cells, having different target program states, from among the memory cells connected to the selected word line is completed, based on one verification voltage among the plurality of verification voltages.

18. The nonvolatile memory device of claim 17, wherein program completion conditions of the memory cells of the different target program states verify-passed by the one verification voltage are different from each other, and
   the program completion conditions include verify-passed counts of the memory cells.

19. The nonvolatile memory device of claim 18, wherein the page buffer includes a plurality of data latches corresponding to the memory cells connected to the selected word line, and
   wherein the data latches store bit values, corresponding to target program states of the corresponding memory cells, from among the plurality of data bits.

20. The nonvolatile memory device of claim 19, wherein when at least one of the memory cells of the different target program states is verify-passed, a bit value of a data latch corresponding to the verify-passed memory cell is changed.

* * * * *